US006930003B2

(12) United States Patent
Yamamukai

(10) Patent No.: US 6,930,003 B2
(45) Date of Patent: Aug. 16, 2005

(54) METHOD OF MANUFACTURING SEMICONDUCTOR DEVICE

(75) Inventor: Kenta Yamamukai, Kawagoe (JP)

(73) Assignee: Seiko Epson Corporation, Tokyo (JP)

( * ) Notice: Subject to any disclaimer, the term of this patent is extended or adjusted under 35 U.S.C. 154(b) by 178 days.

(21) Appl. No.: 10/636,581

(22) Filed: Aug. 8, 2003

(65) Prior Publication Data

US 2004/0097035 A1 May 20, 2004

(30) Foreign Application Priority Data

Sep. 18, 2002 (JP) ........................................ 2002-271723

(51) Int. Cl.⁷ ......................................... H01L 21/8247
(52) U.S. Cl. ...................................................... 438/267
(58) Field of Search ................................. 438/257–267

(56) References Cited

U.S. PATENT DOCUMENTS

| 5,408,115 | A | 4/1995 | Chang |
| 5,422,504 | A | 6/1995 | Chang et al. |
| 5,494,838 | A | 2/1996 | Chang et al. |
| 5,969,383 | A | 10/1999 | Chang et al. |
| 6,177,318 | B1 | 1/2001 | Ogura et al. |
| 6,248,633 | B1 | 6/2001 | Ogura et al. |

(Continued)

FOREIGN PATENT DOCUMENTS

| JP | A 7-161851 | 6/1995 |
| JP | B1 2978477 | 9/1999 |
| JP | A 2001-156188 | 6/2001 |

OTHER PUBLICATIONS

U.S. Appl. No. 10/636,562, filed Aug. 8, 2003, Inoue.
U.S. Appl. No. 10/689,987, filed Oct. 22, 2003, Kasuya.

(Continued)

*Primary Examiner*—Richard A. Booth
(74) *Attorney, Agent, or Firm*—Oliff & Berridge, PLC

(57) ABSTRACT

A method of manufacturing a semiconductor device includes a memory region in which non-volatile memory devices are arranged in a matrix form of a plurality of rows and a plurality of columns to form a memory cell array, the method of manufacturing a semiconductor device including the steps of: forming a gate insulation layer above a semiconductor layer; forming a first conductive layer and a stopper layer having a predetermined pattern above the gate insulation layer; forming a first insulation layer and a second conductive layer over the entire surface of the memory region; forming a first side-wall conductive layer on each of both side surfaces of the first conductive layer, and on the semiconductor layer with the first insulation layer interposed, by anisotropic etching of that second conductive layer; forming a third conductive layer over the entire surface of the memory region; forming a second side-wall conductive layer on each of both side surfaces of the first conductive layer, and on the semiconductor layer with the second insulation layer interposed, by anisotropic etching of that third conductive layer; and forming control gates by isotropic etching of the first and second side-wall conductive layers.

8 Claims, 23 Drawing Sheets

U.S. PATENT DOCUMENTS

| | | |
|---|---|---|
| 6,255,166 B1 | 7/2001 | Ogura et al. |
| 6,413,821 B1 | 7/2002 | Ebina et al. |
| 6,518,124 B1 | 2/2003 | Ebina et al. |
| 6,627,491 B2 | 9/2003 | Ebina et al. |
| 6,656,794 B2 | 12/2003 | Shibata |
| 6,664,155 B2 | 12/2003 | Kasuya |
| 2002/0127805 A1 | 9/2002 | Ebina et al. |
| 2002/0100929 A1 | 1/2003 | Ebina et al. |
| 2003/0057505 A1 | 3/2003 | Ebina et al. |
| 2003/0058705 A1 | 3/2003 | Ebina et al. |
| 2003/0060011 A1 | 3/2003 | Ebina et al. |
| 2003/0157767 A1 | 8/2003 | Kasuya |
| 2003/0166321 A1 | 9/2003 | Kasuya |
| 2003/0166322 A1 | 9/2003 | Kasuya |
| 2003/0190805 A1 | 10/2003 | Inoue |
| 2003/0211691 A1 | 11/2003 | Ueda |
| 2003/0235952 A1 * | 12/2003 | Shibata ........................ 438/257 |
| 2004/0005761 A1 * | 1/2004 | Shibata ........................ 438/261 |
| 2004/0129972 A1 * | 7/2004 | Kasuya ........................ 257/324 |
| 2004/0132247 A1 * | 7/2004 | Kasuya ........................ 438/257 |
| 2005/0032312 A1 * | 2/2005 | Ebina et al. ................. 438/257 |

OTHER PUBLICATIONS

U.S. Appl. No. 10/636,582, filed Aug. 8, 2003, Inoue.
U.S. Appl. No. 10/614,985, filed Jul. 9, 2003, Inoue.
U.S. Appl. No. 10/690,025, filed Oct. 22, 2003, Kasuya.
U.S. Appl. No. 10/689,990, filed Oct. 22, 2003, Kasuya.
U.S. Appl. No. 10/689,993, filed Oct. 22, 2003, Kasuya.
Yutaka Hayashi et al. "Twin MONOS Cell with Dual Control Gates" 2000 Symposium on VLSI Technology Digest of Technical Papers.
Kuo–Tung Chang et al. "A New SONOS Memory Using Source–Side Injection for Programming" IEEE Electron Device Letters, vol. 19, No. 7, Jul. 1998.
Wei–Ming Chen et al. "A Novel Flash Memory Device with Split Gate Source Side Injection and OnO Charge Storage Stack (SPIN)" 1997 Symposium on VLSI Technology Digest of Technical Papers.

* cited by examiner

METHOD OF MANUFACTURING SEMICONDUCTOR DEVICE

Japanese Patent Application No. 2002-271723, filed on Sep. 18, 2002, is hereby incorporated by reference in its entirety.

BACKGROUND OF THE INVENTION

The present invention relates to a method of manufacturing a semiconductor device that includes a memory region, and, in particular, to a method of manufacturing a semiconductor device wherein a non-volatile memory device formed within a memory region has two charge accumulation regions for each word gate.

One type of non-volatile semiconductor memory device is called a metal-oxidenitride-oxide semiconductor (MONOS) type or a silicon-oxide-nitride-oxide-silicon (SONOS) type, wherein a gate insulation layer between a channel region and a control gate is formed of a multi-layer stack of silicon oxide and silicon nitride layers, and charge is trapped in the silicon nitride layer.

A device shown in FIG. 22 is known as an example of this MONOS type of non-volatile semiconductor memory device (disclosed by Y. Hayashi, et al, in 2000 *Symposium on VLSI Technology Digest of Technical Papers*, pp. 122–123).

In this MONOS memory cell 100, a word gate 14 is formed on a semiconductor substrate 10 with a gate insulation layer 12 therebetween. A control gate 20 and a control gate 30 are disposed on either side of the word gate 14, in the shape of side walls. There is an insulation layer 22 between a base portion of the control gate 20 and the semiconductor substrate 10, and a side insulation layer 26 between a side surface of the control gate 20 and the word gate 14. In a similar manner, the insulation layer 22 is between a base portion of the control gate 30 and the semiconductor substrate 10, and the side insulation layer 26 is between a side surface of the control gate 30 and the word gate 14. Impurity layers 16 and 18, which are to form a source region and drain region, are formed in the semiconductor substrate 10 between the opposing control gates 20 and 30 of neighboring memory cells.

In this manner, each memory cell 100 has two MONOS memory elements on the side surfaces of the word gate 14. These two MONOS memory elements can be controlled independently. Thus one memory cell 100 can store two bits of information.

BRIEF SUMMARY OF THE INVENTION

The present invention may provide a method of manufacturing a semiconductor device that is a semiconductor device including a MONOS type of non-volatile memory device having two charge accumulation regions and that, in particular, has resistance to deterioration during the writing/erasing of data.

A method of manufacturing a semiconductor device in accordance with the present invention relates to a method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:

(a) forming a gate insulation layer above a semiconductor layer;

(b) forming a first conductive layer above the gate insulation layer;

(c) forming a stopper layer above the first conductive layer;

(d) patterning the stopper layer and the first conductive layer, to form a stack of layers formed of that stopper layer and that first conductive layer;

(e) forming a first insulation layer over the entire surface of the memory region;

(f) forming a second conductive layer above the first insulation layer, then forming a first side-wall conductive layer on each of two opposed side surfaces of the first conductive layer, and on the semiconductor layer with the first insulation layer interposed, by anisotropic etching of the second conductive layer;

(g) forming a third conductive layer over the entire surface of the memory region, then forming a second side-wall conductive layer on a side surface of the first conductive layer, and on the semiconductor layer with a second insulation layer interposed, by anisotropic etching of that third conductive layer;

(h) forming first and second control gates by isotropic etching of the first and second side-wall conductive layers;

(i) forming an impurity layer to be a source region or a drain region within the semiconductor layer;

(j) forming a third insulation layer over the entire surface of the memory region then removing the third insulation layer so that at least part of the stopper layer is exposed; and (k) removing the stopper layer, then forming a fourth conductive layer and patterning the fourth conductive layer to form a word line.

DETAILED DESCRIPTION OF THE EMBODIMENT

Figure 1:
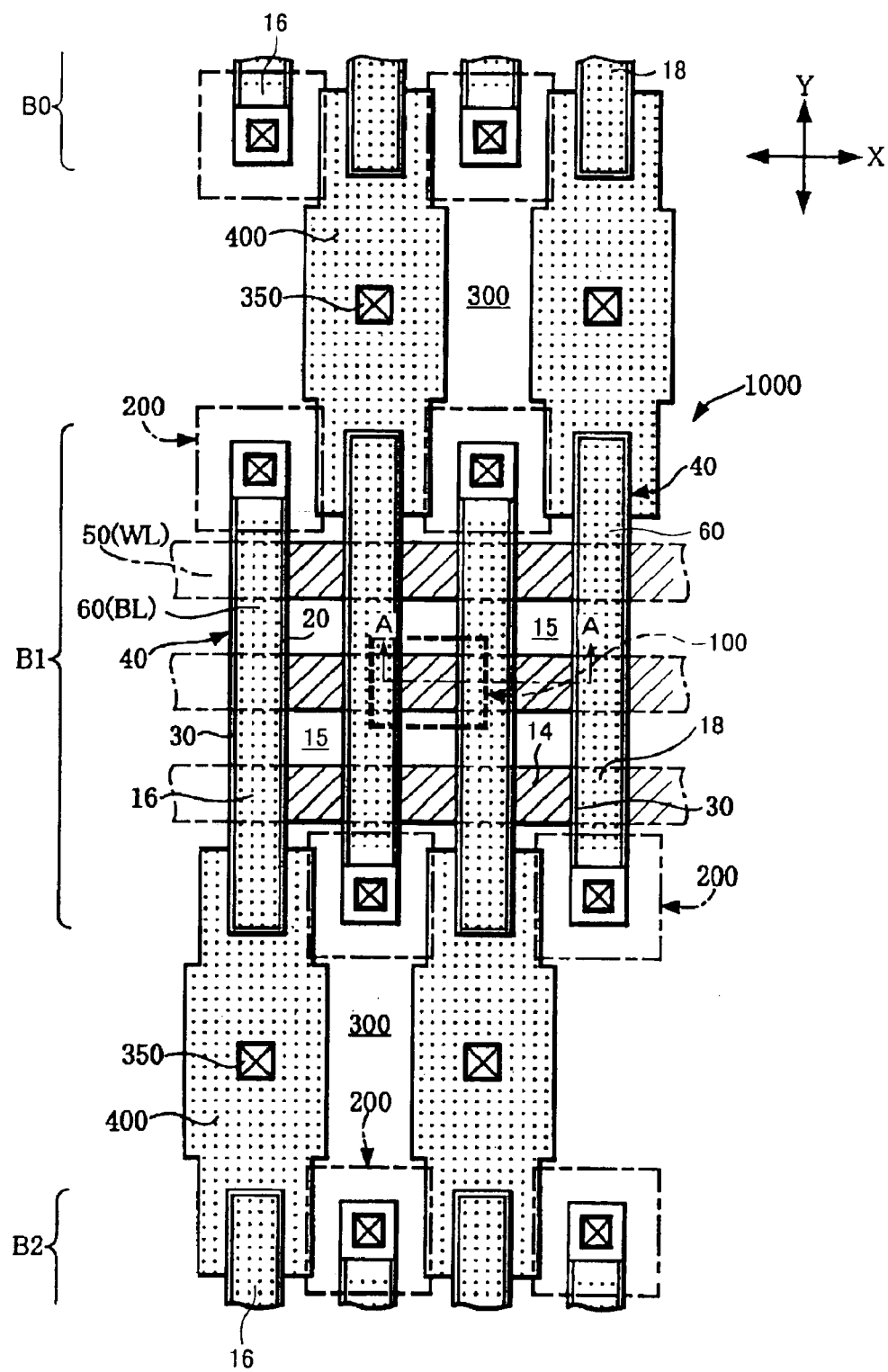
FIG. 1 is a schematic plan view of the layout of the memory region of a semiconductor device.

A method of manufacturing a semiconductor device in accordance with an embodiment of the present invention relates to a method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:

(a) forming a gate insulation layer above a semiconductor layer;

(b) forming a first conductive layer above the gate insulation layer;

(c) forming a stopper layer above the first conductive layer;

(d) patterning the stopper layer and the first conductive layer, to form a stack of layers formed of that stopper layer and that first conductive layer;

(e) forming a first insulation layer over the entire surface of the memory region;

(f) forming a second conductive layer above the first insulation layer, then forming a first side-wall conductive layer on each of two opposed side surfaces of the first conductive layer, and on the semiconductor layer with the first insulation layer interposed, by anisotropic etching of the second conductive layer;

(g) forming a third conductive layer over the entire surface of the memory region, then forming a second side-wall conductive layer on a side surface of the first conductive layer, and on the semiconductor layer with a second insulation layer interposed, by anisotropic etching of that third conductive layer;

(h) forming first and second control gates by isotropic etching of the first and second side-wall conductive layers;

(i) forming an impurity layer to be a source region or a drain region within the semiconductor layer;

(j) forming a third insulation layer over the entire surface of the memory region then removing the third insulation layer so that at least part of the stopper layer is exposed; and (k) removing the stopper layer, then forming a fourth conductive layer and patterning the fourth conductive layer to form a word line.

With the method of manufacturing a semiconductor device in accordance with this embodiment, the first and second side-wall conductive layers are formed by anisotropic etching in steps (f) and (g) then the first and second control gates are formed by isotropic etching. This makes it possible to remove any etching remainder created by the presence of natural oxide films between the first side-wall conductive layer and the second side-wall conductive layer, enabling the formation of control gates of any desired shape.

The method of manufacturing a semiconductor device in accordance with this embodiment may have the following features.

(A) The method of manufacturing a semiconductor device in accordance with this embodiment may further include using the first side-wall conductive layer as a mask to remove part of the first insulation layer, and defining part of the remaining first insulation layer under the removed portion as the second insulation layer, after step (f).

(B) The method of manufacturing a semiconductor device in accordance with this embodiment may further include at least one set of performing anisotropic etching of the first and second side-wall conductive layers after performing isotropic etching of the first and second side-wall conductive layers, to adjust the heights of the first and second side-wall conductive layers, after step (g).

(C) In the method of manufacturing a semiconductor device in accordance with this embodiment, in step (f), the first side-wall conductive layer may be formed in such a manner that a peak portion of the first side-wall conductive layer is positioned lower than an upper surface of the stack of layers but above the conductive layer that forms the stack of layers.

(D) In the method of manufacturing a semiconductor device in accordance with this embodiment, the first side-wall conductive layer may be formed in such a manner that a peak portion of the first side-wall conductive layer is positioned lower than an upper surface of the conductive layer that forms the stack of layers.

(E) In the method of manufacturing a semiconductor device in accordance with this embodiment, the third conductive layer may have a film thickness that is greater than the width of the second control gate.

(F) In the method of manufacturing a semiconductor device in accordance with this embodiment, the isotropic etching may be performed by chemical dry etching (G) In the method of manufacturing a semiconductor device in accordance with this embodiment, the first insulation layer may be a stack of a first silicon oxide film, a silicon nitride film, and a second silicon oxide film.

The method of manufacturing a semiconductor device in accordance with this embodiment is described in detail below.

1. Configuration of Semiconductor Device

The description first concerns the configuration of a semiconductor device that is obtained by the method of manufacturing a semiconductor device in accordance with this embodiment. A plan view of the layout of a semiconductor device obtained by this embodiment is shown in FIG. 1. The semiconductor device includes a memory region 1000 having a non-volatile memory device.

MONOS type non-volatile memory devices (hereinafter called "memory cells") are disposed within the memory region 1000 in a matrix of a plurality of rows and columns. A first block B1 and parts of blocks B0 and B2 adjacent thereto are shown in this memory region 1000. The blocks B0 and B2 are configured opposite to block B1.

An element isolation region 300 is formed in each partial region between the first block B1 and the adjacent block B0 or B2. Each block is provided with a plurality of word lines 50 (WL) extending in an X direction (row direction) and a plurality of bit lines 60 (BL) extending in a Y direction (column direction). Each word line 50 is connected to a plurality of word gates 14 disposed in the X direction. Each bit line 60 is configured of impurity layers 16 and 18.

A conductive layer 40 that forms control gates 20 and 30 is formed so as to surround each of the impurity layers 16 and 18. In other words, the control gates 20 and 30 each extend in the Y direction and the portions at one end of the pair of control gates 20 and 30 are connected together by the conductive layer extending in the X direction. The other end portions of each pair of the control gates 20 and 30 are connected to one common contact portion 200. Thus, the conductive layer 40 functions both as a control gate for a memory cell and as interconnect that connects the control gates that are arrayed in the Y direction.

A single memory cell 100 includes one word gate 14, the control gates 20 and 30, and the impurity layers 16 and 18. The control gates 20 and 30 are formed on either side of the word gate 14. The impurity layers 16 and 18 are formed on the outer sides of the control gates 20 and 30. The impurity layers 16 and 18 are owned in common by adjacent memory cells 100.

The impurity layer 16 formed in block B1 and the impurity layer 16 formed in block B2, which are impurity layers 16 that are mutually adjacent in the Y direction, are electrically connected together by a contact impurity layer 400 that is formed in the semiconductor substrate 100. This contact impurity layer 400 is formed on the opposite side of the impurity layer 16 from a common contact section 200.

A contact 350 is formed on top of this contact impurity layer 400. The bit line 60 formed by the impurity layer 16 is connected electrically to an interconnection layer in an upper layer by this contact 350.

Similarly, two impurity layers 18 that are mutually adjacent in the Y direction (the impurity layer 18 formed in block B1 and the impurity layer 18 formed in block B0) are electrically connected by the contact impurity layer 400 on the sides on which the common contact portions 200 are not disposed. As can be seen from FIG. 1, the layout in plan of a plurality of the common contact portions 200 in one block is formed on alternating sides of the impurity layers 16 and the impurity layers 18, in a zigzag arrangement. The layout in plan of a plurality of the contact impurity layers 400 is formed on alternating sides of the impurity layers 16 and the impurity layers 18, in a zigzag arrangement.

Figure 2:
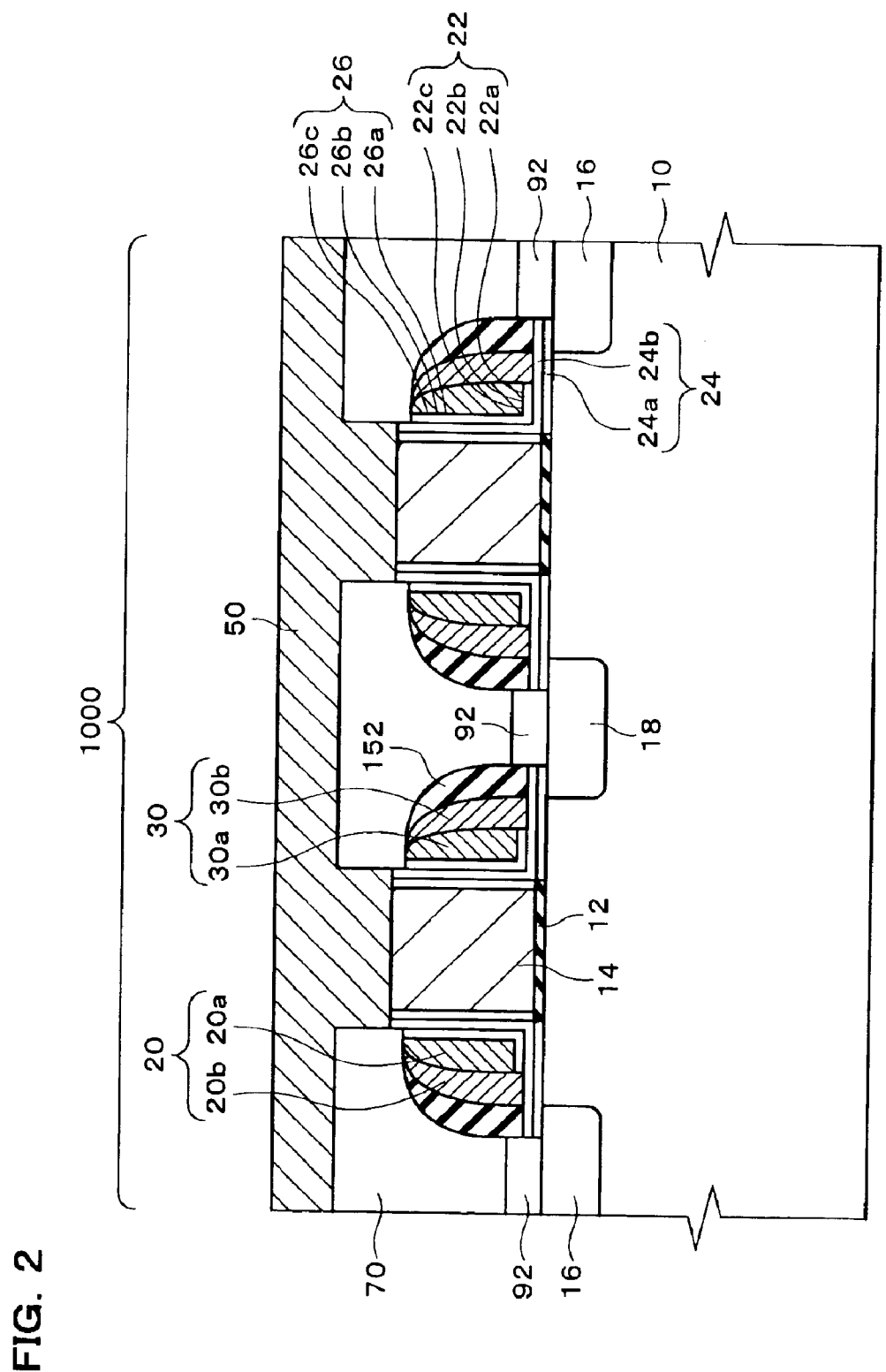
FIG. 2 is a schematic section taken along the line A—A of FIG. 1.
Figure 3:
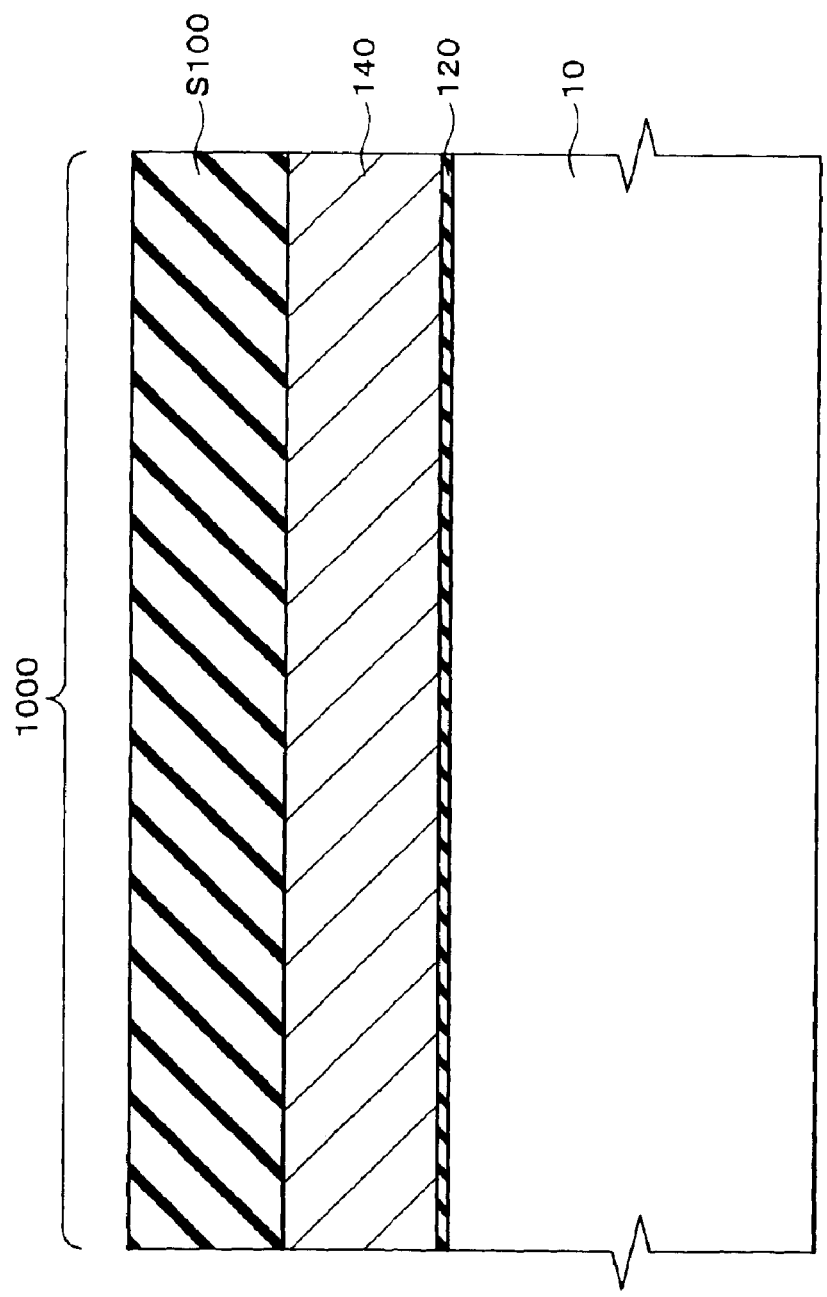
FIG. 3 is a sectional view of one step in the manufacture method in accordance with the first embodiment.

The description now turns to the configuration of the semiconductor device in section, with reference to FIG. 2. FIG. 2 is a section taken along the line A—A of FIG. 1.

The memory cell 100 in the memory region 1000 includes the word gate 14, the impurity layers 16 and 18, and the control gates 20 and 30. The word gate 14 is formed above the semiconductor substrate 10 with a gate insulation layer 12 therebetween. The impurity layers 16 and 18 are formed within the semiconductor substrate 10. Each impurity layer will form a source region or a drain region. A silicide layer 92 is formed above the impurity layers 16 and 18.

The control gates 20 and 30 are formed on either side of the word gate 14. The control gate 20 is formed of a first control gate 20a and a second control gate 20b in mutual contact. The first control gate 20a is formed above the semiconductor substrate 10 with a first insulation layer 22 therebetween and is also formed on one side surface of the word gate 14 with a side insulation layer 26 therebetween. The second control gate 20b is formed above the semiconductor substrate with a second insulation layer 24 therebe-tween. Similarly, the control gate 30 is formed of a first control gate 30a and a second control gate 30b.

The first insulation layer 22 is an ONO film. More specifically, the first insulation layer 22 is a stack of a bottom silicon oxide layer (first silicon oxide layer) 22a, a silicon nitride layer 22b, and a top silicon oxide layer (second silicon oxide layer) 22c, in sequence from the semiconductor substrate 10 side.

The second insulation layer 24 is an NO film. More specifically, the second insulation layer 24 is a stack of a bottom silicon oxide layer (first silicon oxide layer) 24a and a silicon nitride layer 24b.

The first silicon oxide layer 22a forms a potential barrier between a channel region and a charge accumulation region. The silicon nitride layer 22b functions as a charge accumulation region that traps carriers (such as electrons). The second silicon oxide layer 22c forms a potential barrier between the control gate and the charge accumulation region.

The side insulation layer 26 is an ONO film. More specifically, the side insulation layer 26 is a stack of a first silicon oxide layer 26a, a silicon nitride layer 26b, and a second silicon oxide layer 26c, in sequence from the word gate 14 side. The side insulation layer 26 isolates the word gate 14 electrically from each of the control gates 20 and 30. The upper edge of at least the first silicon oxide layer 26a of the side insulation layer 26 is positioned higher above the semiconductor substrate 10 than the upper edges of the control gates 20 and 30 in order to prevent any short-circuiting between the word gate 14 and the control gates 20 and 30.

The side insulation layer 26 and the first insulation layer 22 have a similar stack configuration.

The surface of each of the control gates 20 and 30 is covered by a side-wall insulation layer 152.

An embedded insulation layer 70 is formed between the neighboring control gate 20 and control gate 30 of adjacent memory cells 100. This embedded insulation layer 70 covers them in such a manner that at least the control gates 20 and 30 are not exposed. In addition, the upper surface of the embedded insulation layer 70 is positioned higher above the semiconductor substrate 10 than the upper surface of the word gate 14. Forming the embedded insulation layer 70 in this manner makes it possible to provide reliable electrical isolation between the control gates 20 and 30 and the word gate 14 and the word line 50.

The word line 50 is formed above the word gate 14 as shown in FIG. 2.

In the semiconductor device obtained by the manufacture method in accordance with this embodiment, the control gates 20 and 30 are formed of the first control gates 20a and 30a and the second control gates 20b and 30b, respectively that are formed above insulation layers of different film thicknesses. For that reason, the potential of the substrate surface below the control gates 20 and 30 also changes in a two-stage manner, and the field strength has peaks in three types of locations: the boundaries between the word gate 14 and the control gates 20 and 30, the boundaries between the first control gates 20a and 30a and the second control gates 20b and 30b, and the edge portions of the impurity regions. This has advantages relating to the writing and erasing of data with respect to the memory cell 100, as described below.

The description first concerns data write. During data write, electrons that have migrated into the impurity region 16 receive energy at the boundary between the word gate 14 and the control gate 30 and again receive energy at the boundary region between the first control gate 30*a* and the second control gate 30*b*, to become hot electrons, and are implanted and trapped in the first insulation layer 22 in the vicinity of the stepped portion.

In the semiconductor device in accordance with this embodiment, the positions at which the electrons are implanted are distributed about the center of the boundary portion of the first control gate 30*a* and the second control gate 30*b*. Since the second insulation layer 24 formed of an NO film is below the second control gate 30*b*, however, the charge escapes to the control gate 30. As a result, the electrons trapped on the first control gate 30*a* side remain.

Figure 23:
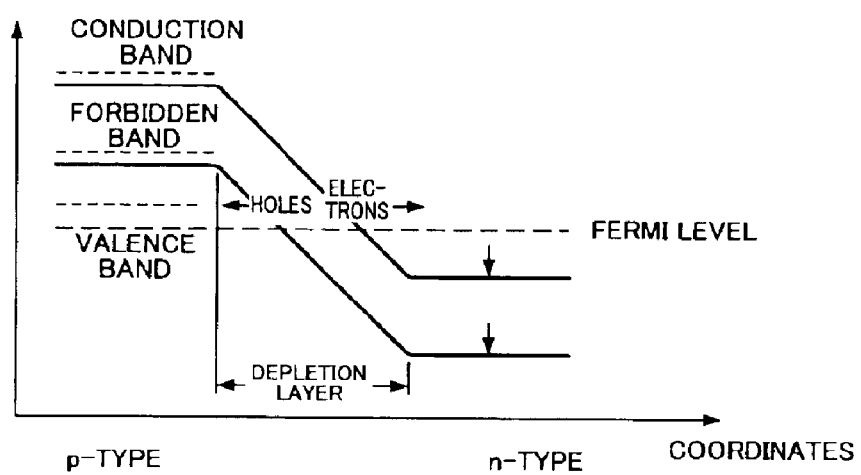
FIG. 23 is illustrative of the operation of erasing in the semiconductor device in accordance with the present invention.

The description now turns to data erasure, with reference to FIG. 23. FIG. 23 is a band chart with the potential energy of electrons along the vertical axis and actual spatial coordinates along the horizontal axis at the edge of the impurity layer 18, in other words, the state at a pn junction portion.

First of all, a high positive voltage is applied to the impurity layer 18 and a negative voltage is applied to the control gate 30. As a result, the potential energy of electrons in the impurity layer 18 that is an n-type region is reduced (the potential energy of the electrons in the n-type region shifts in the direction of the arrow in FIG. 23). In the high-density pn junction, the thickness of the depleted layer is extremely small at only a few nm, making it possible for the electrons in the p-type electron band to migrate by the tunneling effect into the n-type conductive band. In other words, positive holes are created in the vicinity of the edge of the impurity layer 18, which is a p-type region, as the electrons migrate. This means that a hole accumulation layer is formed in the vicinity of the edge of the impurity layer.

In this case, attention is drawn to the electrical fields between the second control gate 30*b* formed above the second insulation layer 24 and the first control gate 30*a* formed above the first insulation layer 22, and the substrate surface. Since the hole accumulation layer is formed in the second insulation layer 24, carrier conductivity is high. Thus the electrical field in the lateral direction (in the longitudinal gate direction) is relatively low. Since the second insulation layer 24 is thinner than the first insulation layer 22, the electrical field in the orthogonal direction is relatively high. Thus, the holes that are created in the vicinity of the edge of the impurity layer 18 cannot jump into the second insulation layer 24.

In the first insulation layer 22 region, on the other hand, the electrical field is relatively high in the lateral direction but relatively low in the orthogonal direction. Thus, the holes that are created in the vicinity of the edge of the impurity layer 18 have a large amount of energy in the boundary between the second insulation layer 24 region and the first insulation layer 22 region, and jump into the charge accumulation film. In other words, holes are implanted into locations close to a region where the thickness of the charge accumulation film is different, and erasing is done at those positions.

This makes it possible to ensure that the positions at which electrons are implanted during writing match the positions at which holes are implanted during erasure. As a result, it is possible to implement a non-volatile memory device that does not deteriorate even during repetitions of the write/erase cycle.

2. Method of Manufacturing Semiconductor Device 2.1 First Embodiment

The description now turns to a method of manufacturing the semiconductor device in accordance with a first embodiment, with reference to FIGS. 3 to 15. Each section corresponds to the portion taken along the line A—A of FIG. 1. In FIGS. 3 to 15, the same reference numbers are used to denote substantially the same portions as those shown in FIGS. 1 and 2, and redundant description is omitted.

(1) First of all, the element isolation region 300 is formed by a trench isolation method in the surface of the semiconductor substrate 10 (see FIG. 1). Ions of a p-type impurity are then implanted as channel doping. The contact n-type impurity layer 400 (see FIG. 1) is then formed in the semiconductor substrate 10.

A insulation layer 120 that will form the gate insulation layer is then formed on the surface of the semiconductor substrate 10. A gate layer (first conductive layer) 140 that will form the word gate 14 is deposited over the insulation layer 120. The gate layer 140 is formed of doped polysilicon. A stopper layer S100, which is used in the CMP step later, is then formed on the gate layer 140. The stopper layer S100 is formed from a silicon nitride layer.

Figure 4:
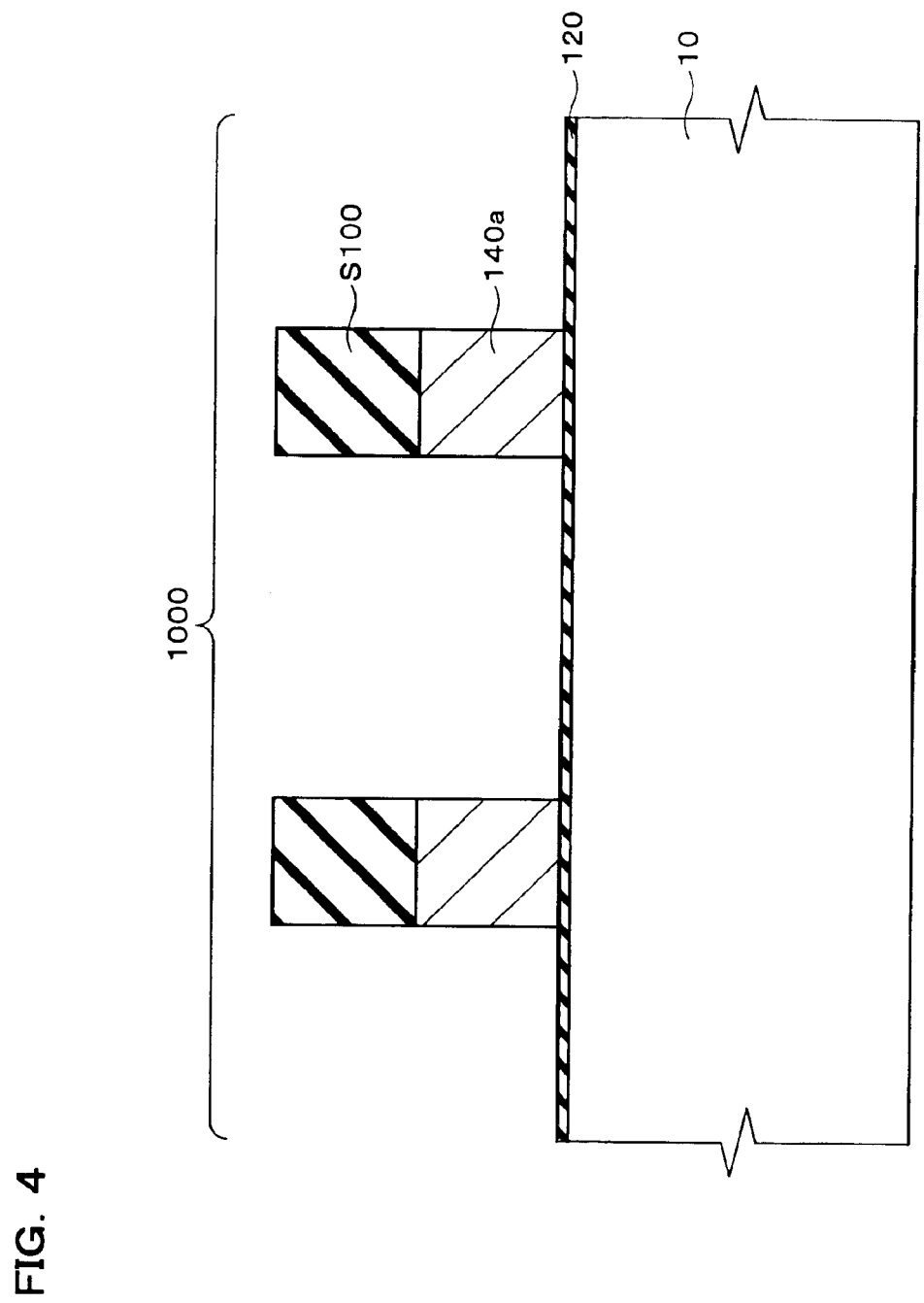
FIG. 4 is a sectional view of one step in the manufacture method in accordance with the first embodiment.

(2) A resist layer (not shown in the figure) is then formed. This resist layer is used as a mask for patterning the stopper layer S100. The thus-patterned stopper layer S100 is used as a mask for etching the gate layer 140. As shown in FIG. 4, the gate layer 140 is patterned to form a gate layer (word gate) 140*a*.

Figure 5:
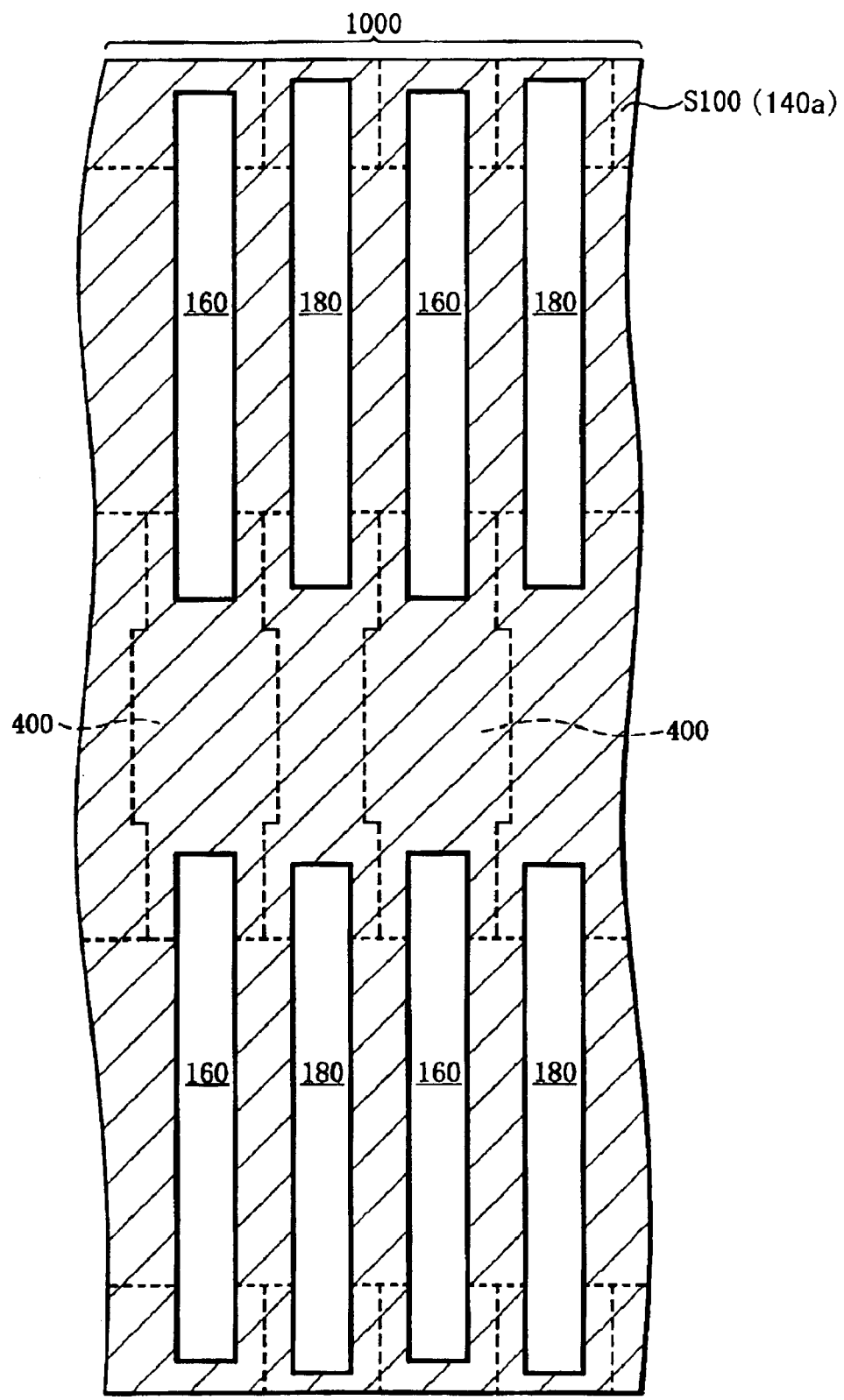
FIG. 5 is a sectional view of one step in the manufacture method in accordance with the first embodiment.

The status after the patterning is shown in plan view in FIG. 5. Aperture portions 160 and 180 are provided by this patterning in the stack formed by the gate layer 140*a* and the stopper layer S100 within the memory region 1000. The aperture portions 160 and 180 correspond substantially to regions in which the impurity layers 16 and 18 will be formed by subsequent ion implantation. The side insulation layers and control gates will also be formed on the side surfaces of the aperture portions 160 and 180 by subsequent processing.

Figure 6:
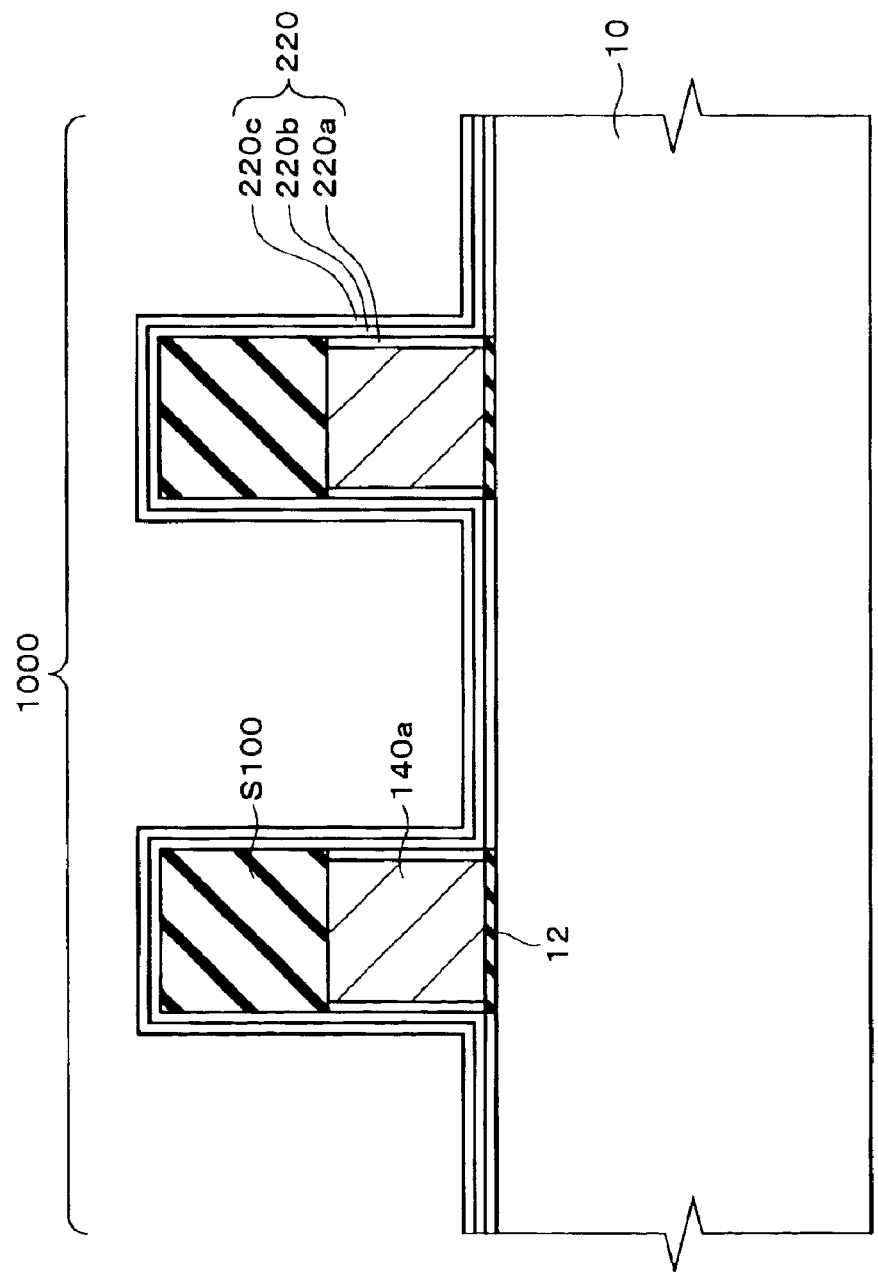
FIG. 6 is a plan view of one step in the manufacture method shown in FIG. 5.

(3) Dilute hydrofluoric acid is then used to wash the surface of the semiconductor substrate 10. This removes the exposed insulation layer 120. A first silicon oxide layer 220*a* is then formed by a thermal oxidation method, as shown in FIG. 6. The first silicon oxide layer 220*a* is formed on the exposed surfaces of the semiconductor substrate 10 and the gate layer 140*a*. Note that the Annealing is then performed on the first silicon oxide layer 220*a*. This annealing is performed in an environment including $NH_3$. This preprocessing facilitates the uniform deposition of a silicon nitride layer 220*b* above the first silicon oxide layer 220*a*. The silicon nitride layer 220*b* can be subsequently formed by a CVD method.

A second silicon oxide layer 220*c* is then formed by a CVD method, specifically by high-temperature oxidation (HTO). The second silicon oxide layer 220*c* can also be formed by using in-situ steam generation (ISSG). ISSG processing enables compact film formation. If the film is formed by ISSG processing, the ONO film 220 will be very compact so annealing can be omitted.

Note that forming the silicon nitride layer 220*b* and the second silicon oxide layer 220*c* in the same furnace in the above-described step makes it possible to prevent contamination of the boundary surfaces due to removal from the furnace. Since this enables the formation of a homogeneous ONO film 220, it enables the creation of a memory cell 100 with stable electrical characteristics.

In this embodiment of the invention, subsequent patterning creates the first insulation layer 22, the second insulation layer 24, and the side insulation layer 26 from the ONO film 220 (see FIG. 2).

Figure 7:
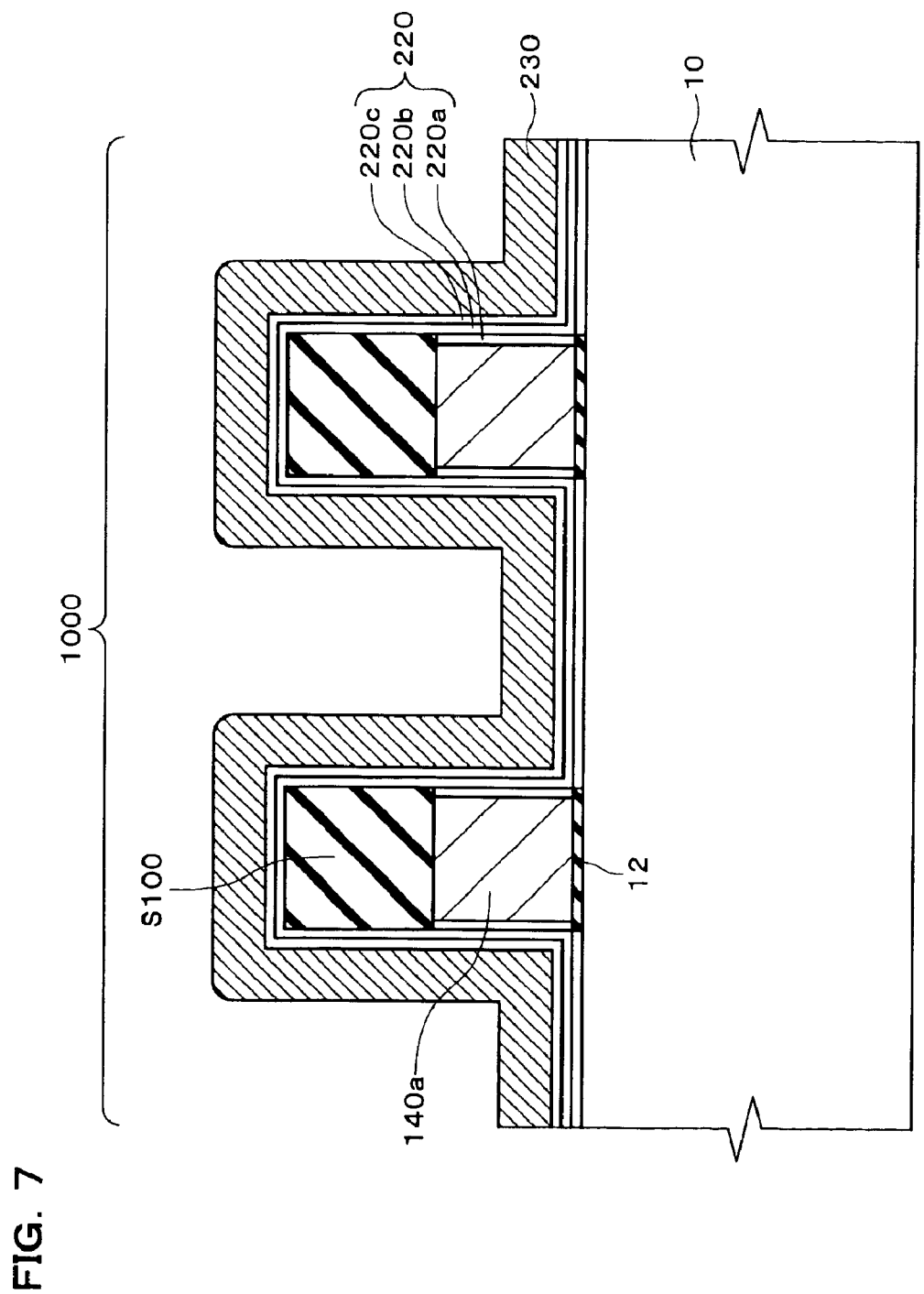
FIG. 7 is a sectional view of one step in the manufacture method in accordance with the first embodiment.

(4) As shown in FIG. 7, a doped polysilicon layer (second conductive layer) 230 is formed over the second silicon oxide layer 220*c*. The doped polysilicon layer 230 will become the conductive layer 40 (see FIG. 1) that forms the first control gates 20a and 30a, by subsequent etching.

Figure 8:
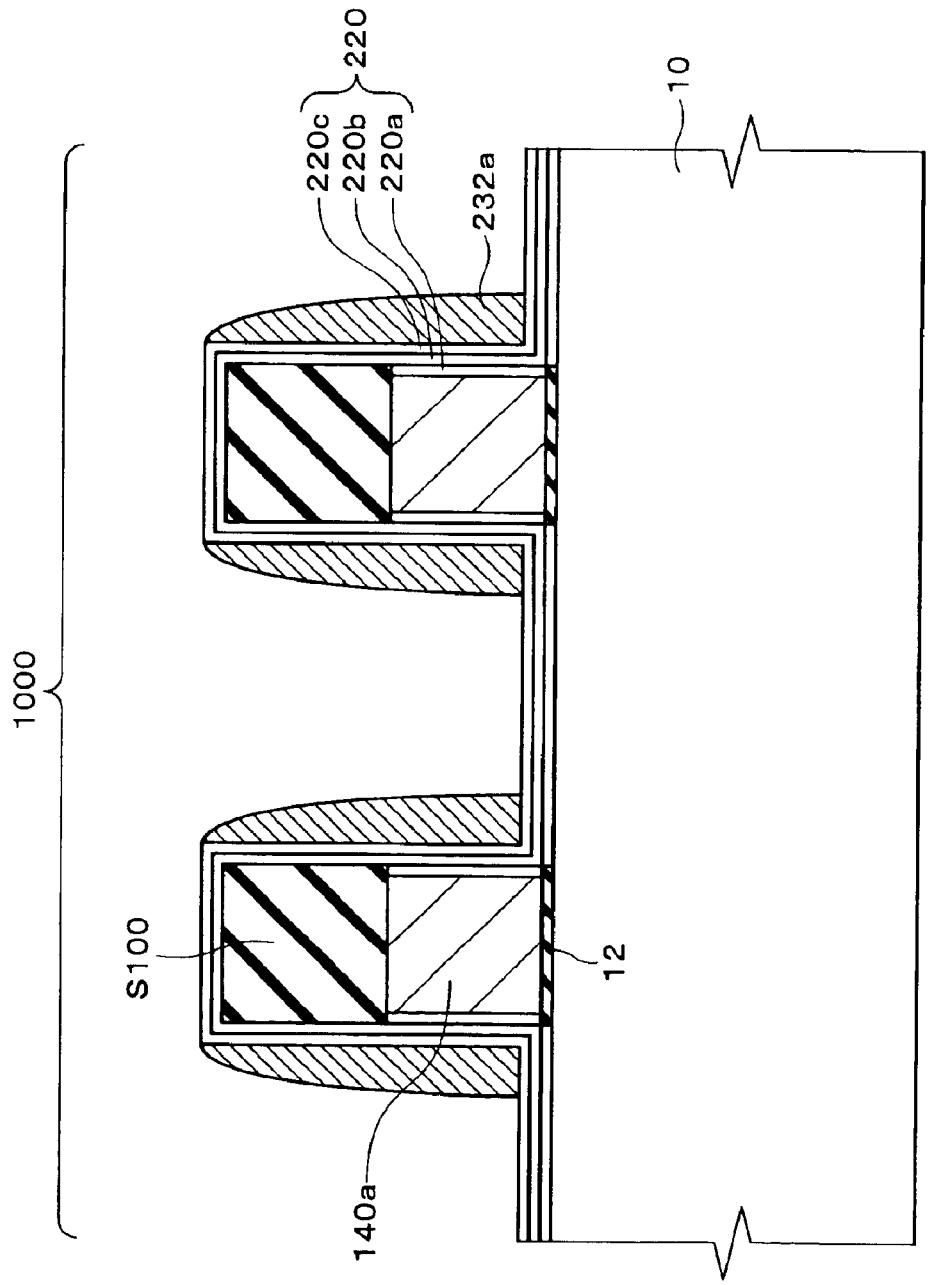
FIG. 8 is a sectional view of one step in the manufacture method in accordance with the first embodiment.

(5) As shown in FIG. 8, the entire surface of the doped polysilicon layer 230 is subjected to anisotropic etching. This forms a side-wall shaped conductive layer 232a (first side-wall conductive layer) along the side surfaces of the aperture portions 160 and 180 of the memory region 1000 (see FIG. 5). The side-wall shaped conductive layer 232a is etched in a subsequent step to become the first control gates 20a and 30a.

Figure 9:
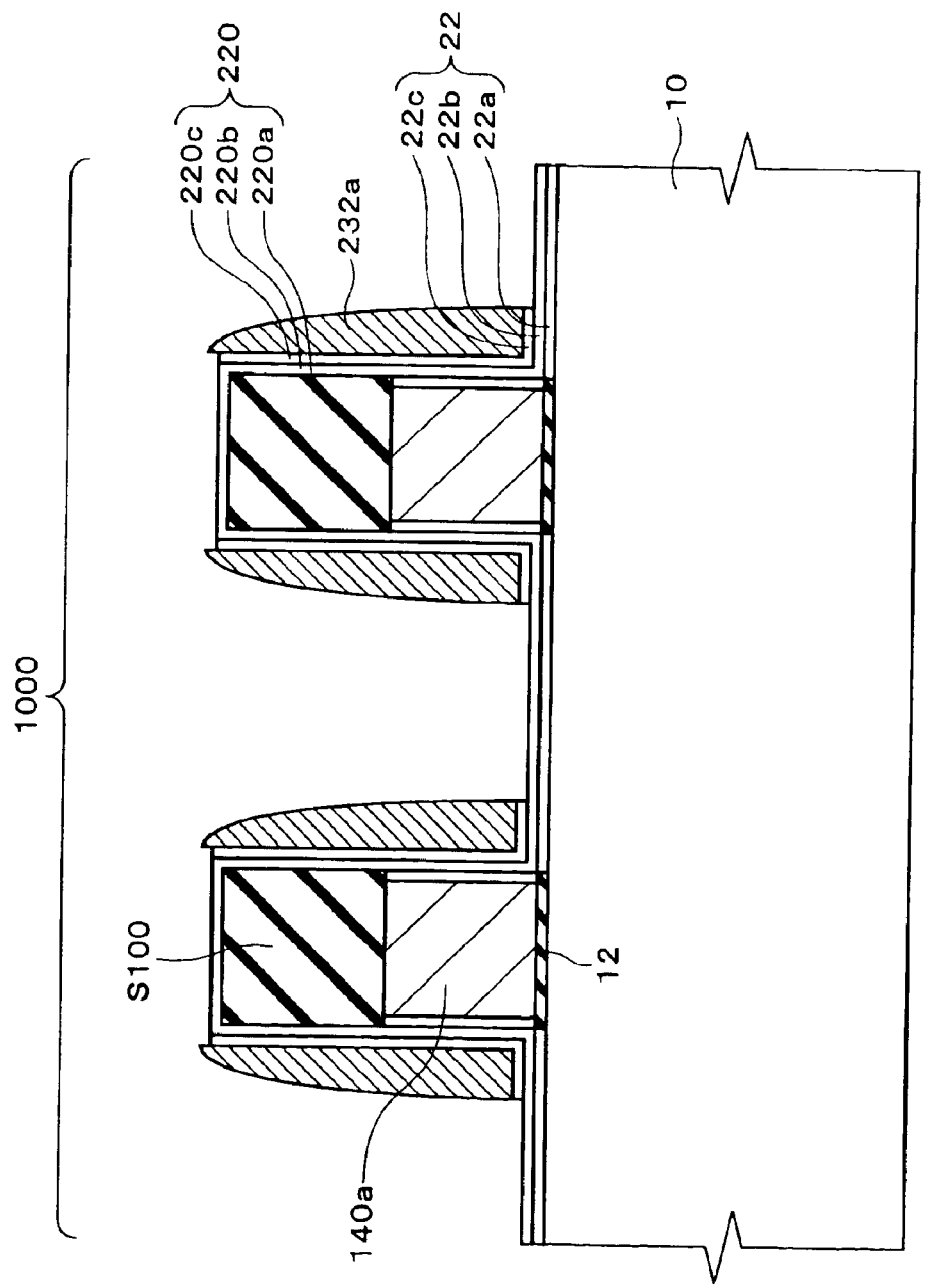
FIG. 9 is a sectional view of one step in the manufacture method in accordance with the first embodiment.

(6) The side-wall shaped conductive layer 232a is then used as a mask to remove part of the ONO film 220, as shown in FIG. 9.

Figure 10:
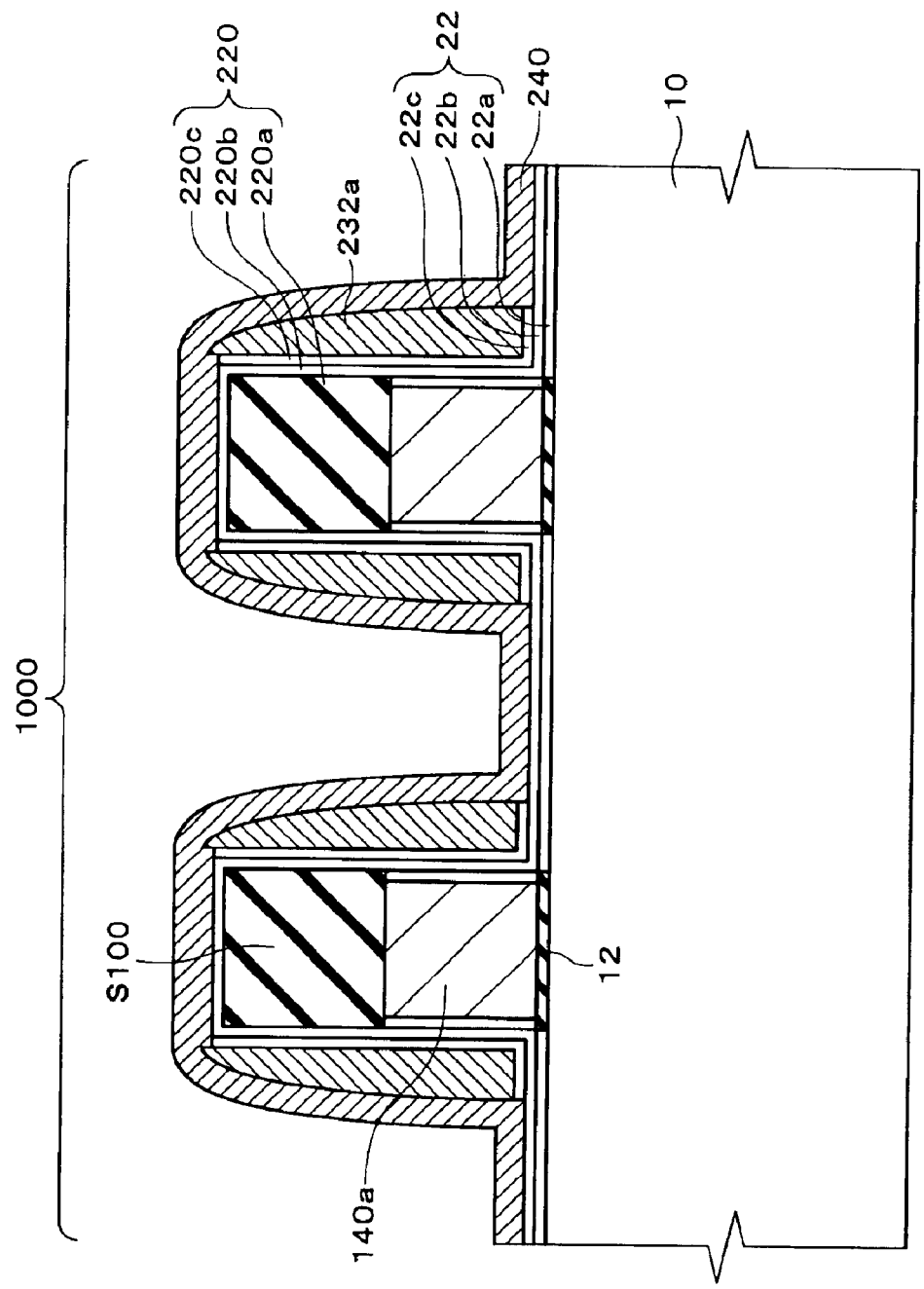
FIG. 10 is a sectional view of one step in the manufacture method in accordance with the first embodiment.
Figure 11:
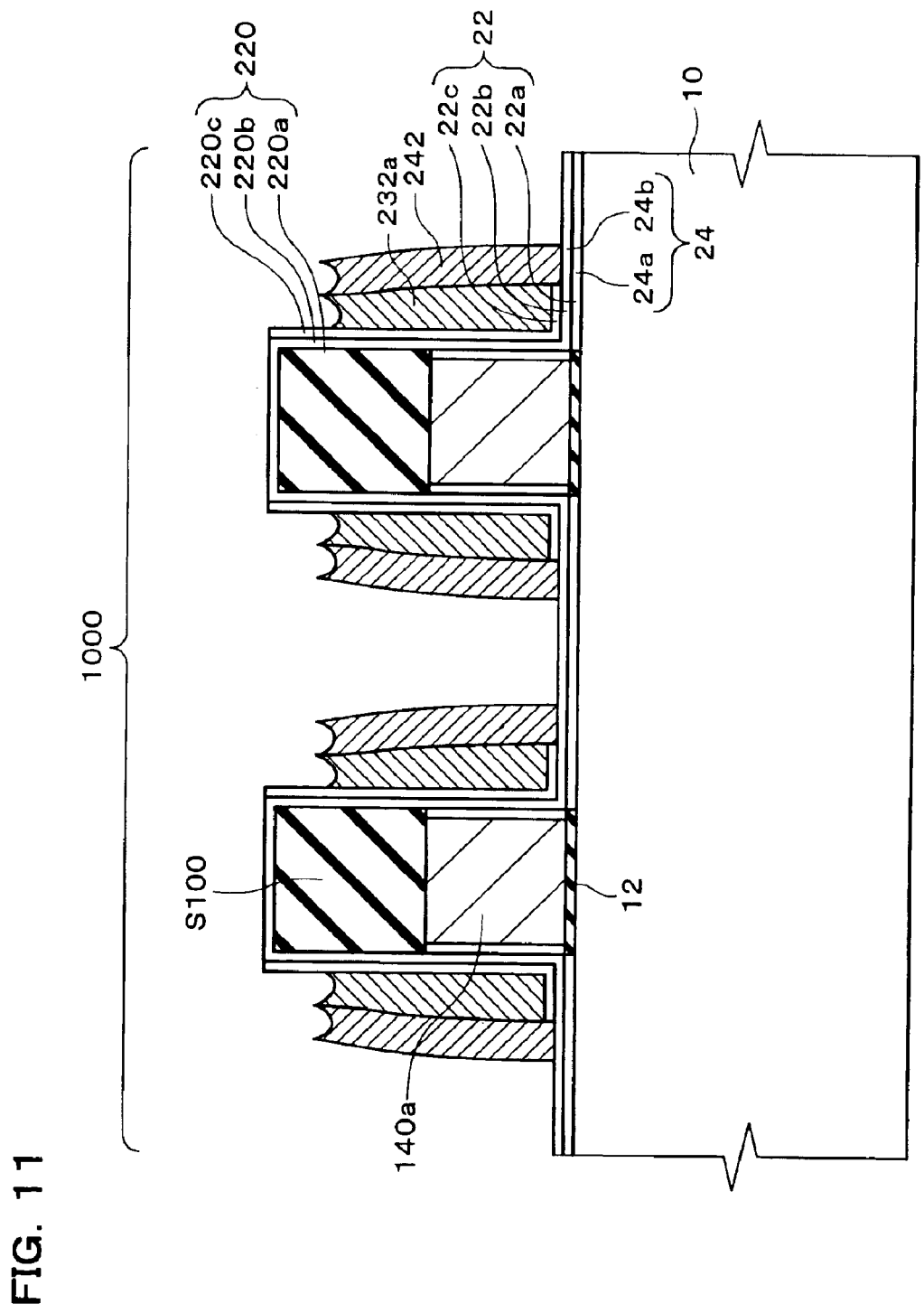
FIG. 11 is a sectional view of one step in the manufacture method in accordance with the first embodiment.

(7) A doped polysilicon layer 240 is then formed over the entire surface, as shown in FIG. 10. The entire surface of the doped polysilicon layer 240 is subsequently subjected to anisotropic etching. This lowers the height of the side-wall shaped conductive layer 232a, forming a side-wall shaped conductive layer (second side-wall conductive layer) 242 on the side of the side-wall shaped conductive layer 232a, as shown in FIG. 11. The side-wall shaped conductive layer 242 is formed over the semiconductor substrate 10 with the second insulation layer 24 therebetween. The side-wall shaped conductive layer 242 will become the second control gates 20b and 30b by etching in a subsequent step. This etching is done in such a manner that the side-wall shaped conductive layer 232a is positioned higher than the desired height of the first control gates 20a and 30a and the side-wall shaped conductive layer 242 is positioned higher than the desired height of the second control gates 20b and 30b.

This etching is performed under conditions such that the etching selection ratio for silicon and silicon oxide (the silicon etching rate/the silicon oxide etching rate) is 300. This ensures the creation of an etching remainder of the natural oxide film (called a "fence") between the side-wall shaped conductive layer 232a and the side-wall shaped conductive layer 242 and on the surface of the side-wall shaped conductive layer 242, as shown in FIG. 11.

Figure 12:
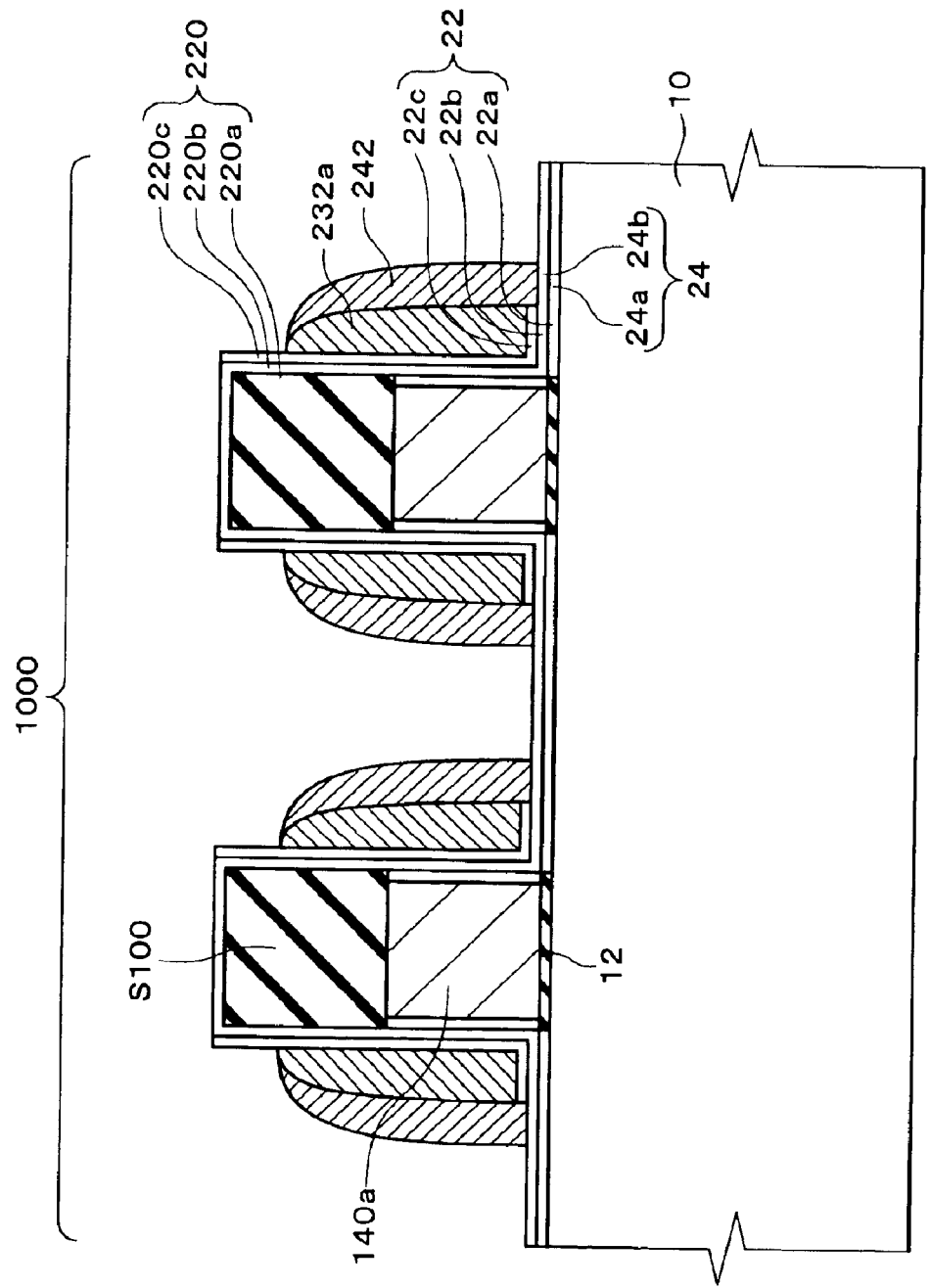
FIG. 12 is a sectional view of one step in the manufacture method in accordance with the first embodiment.

The side-wall shaped conductive layers 232a and 242 are then subjected to isotropic etching. This makes it possible to smooth the surfaces of the side-wall shaped conductive layers 232a and 242, as shown in FIG. 12. This isotropic etching could be chemical dry etching, by way of example. Chemical dry etching is etching performed in a plasma chamber in which a plasma is generated and an etching apparatus having a different etching chamber. The use of this chemical dry etching reduces damage to the workpiece and enables uniform etching.

Anisotropic etching is again performed to etch the side-wall shaped conductive layers 232a and 242 to a predetermined height. This turns the side-wall shaped conductive layer 232a into the first control gates 20a and 30a and the side-wall shaped conductive layer 242 into the second control gates 20b and 30b. Isotropic etching is then performed to smooth the surfaces of the control gates 20 and 30. This isotropic etching could be performed by chemical dry etching. The anisotropic etching and isotropic etching could be repeated a plurality of times if necessary.

Figure 14:
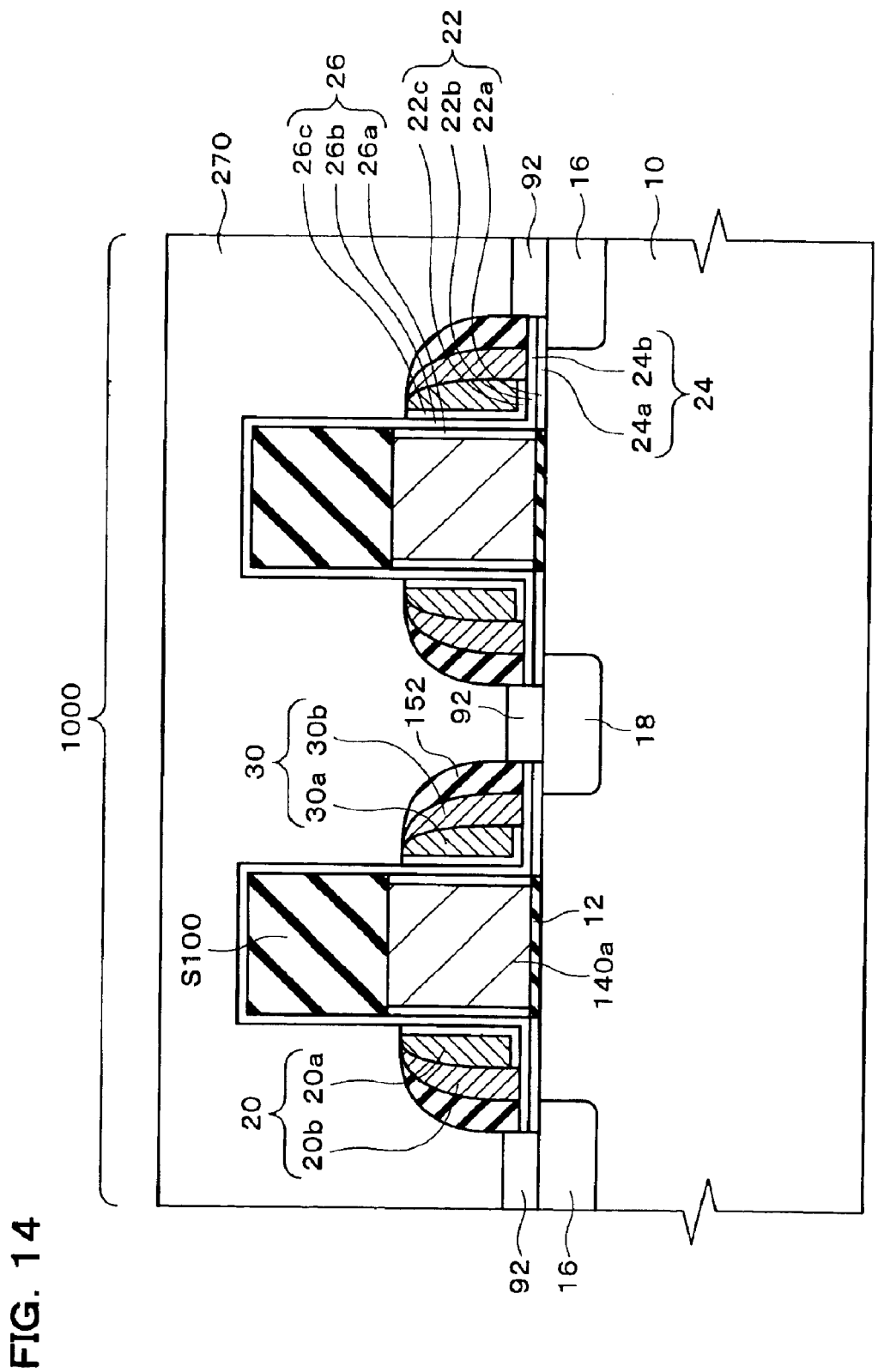
FIG. 14 is a sectional view of one step in the manufacture method in accordance with the first embodiment.

(8) An insulation layer (not shown in the figures) is formed over the entire surface in the memory region 1000, of a material such as silicon oxide or silicon nitride oxide. The side-wall isolation layer 152 that covers the control gates 20 and 30 is formed by anisotropic etching of this insulation layer, as shown in FIG. 14. This etching also removes the insulation layer deposited on the region in which the silicide layer will be formed by subsequent processing, to expose the semiconductor substrate 10.

Ions of an n-type impurity are then implanted to form the impurity layers 16 and 18 in the semiconductor substrate 10, as shown in FIG. 14.

A metal for forming a silicide is then deposited over the entire surface. The metal for forming the silicide could be titanium or cobalt, by way of example. The silicide layer 92 is then formed on the exposed surface of the semiconductor substrate 10 by a silicide reaction of the metal formed over the semiconductor substrate. A third isolation layer 270 of a material such as silicon oxide or silicon nitride oxide is then formed over the entire surface of the memory region 1000. The third isolation layer 270 is formed to cover the stopper layer S100.

Figure 15:
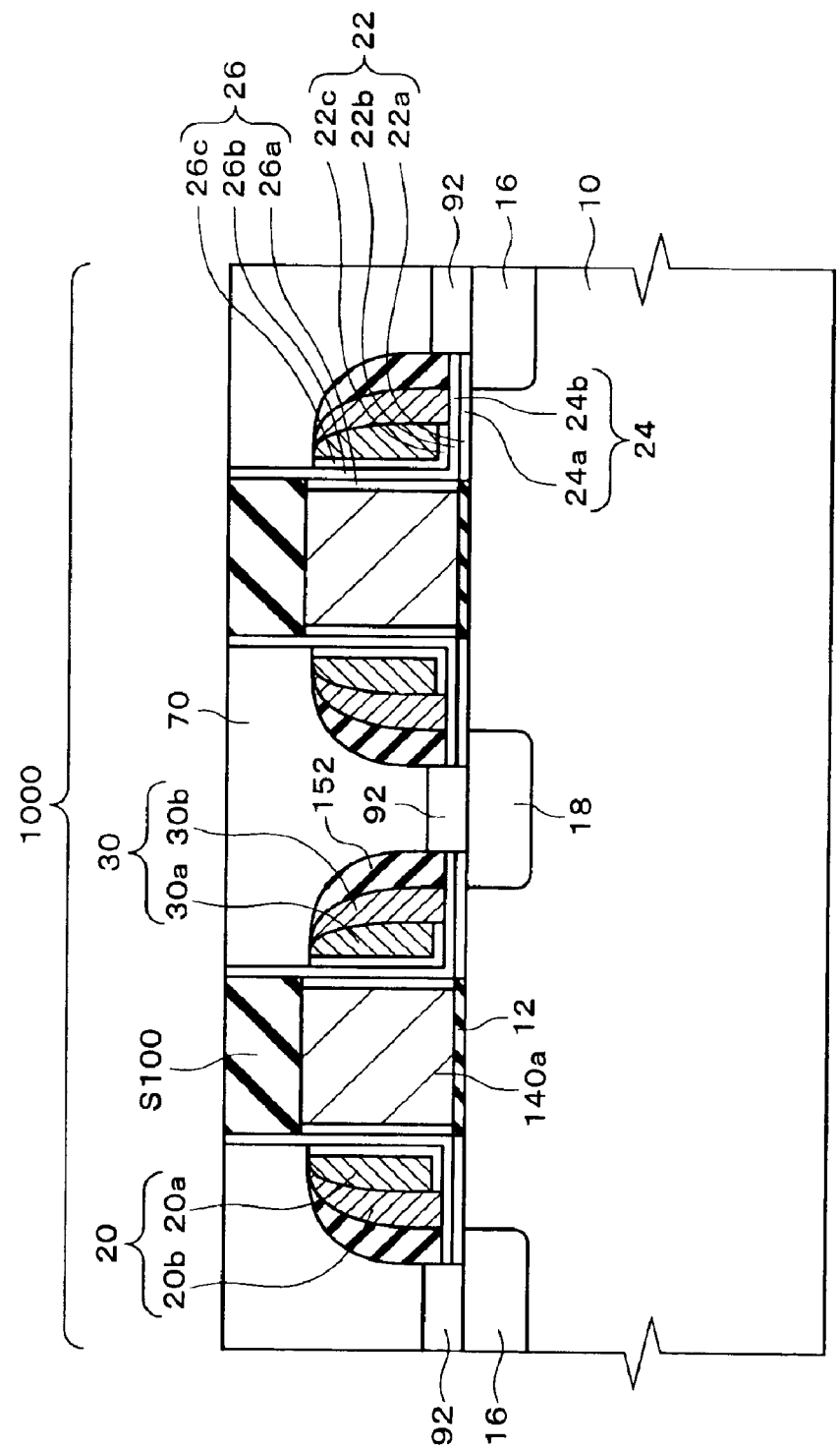
FIG. 15 is a sectional view of one step in the manufacture method in accordance with the first embodiment.

(9) As shown in FIG. 15, the third insulation layer 270 is polished by a CMP method far enough to expose the stopper layer S100, and the third isolation layer 270 is made uniform. This polishing leaves the embedded insulation layer 70 between the opposing control gates 20 and 30.

Figure 16:
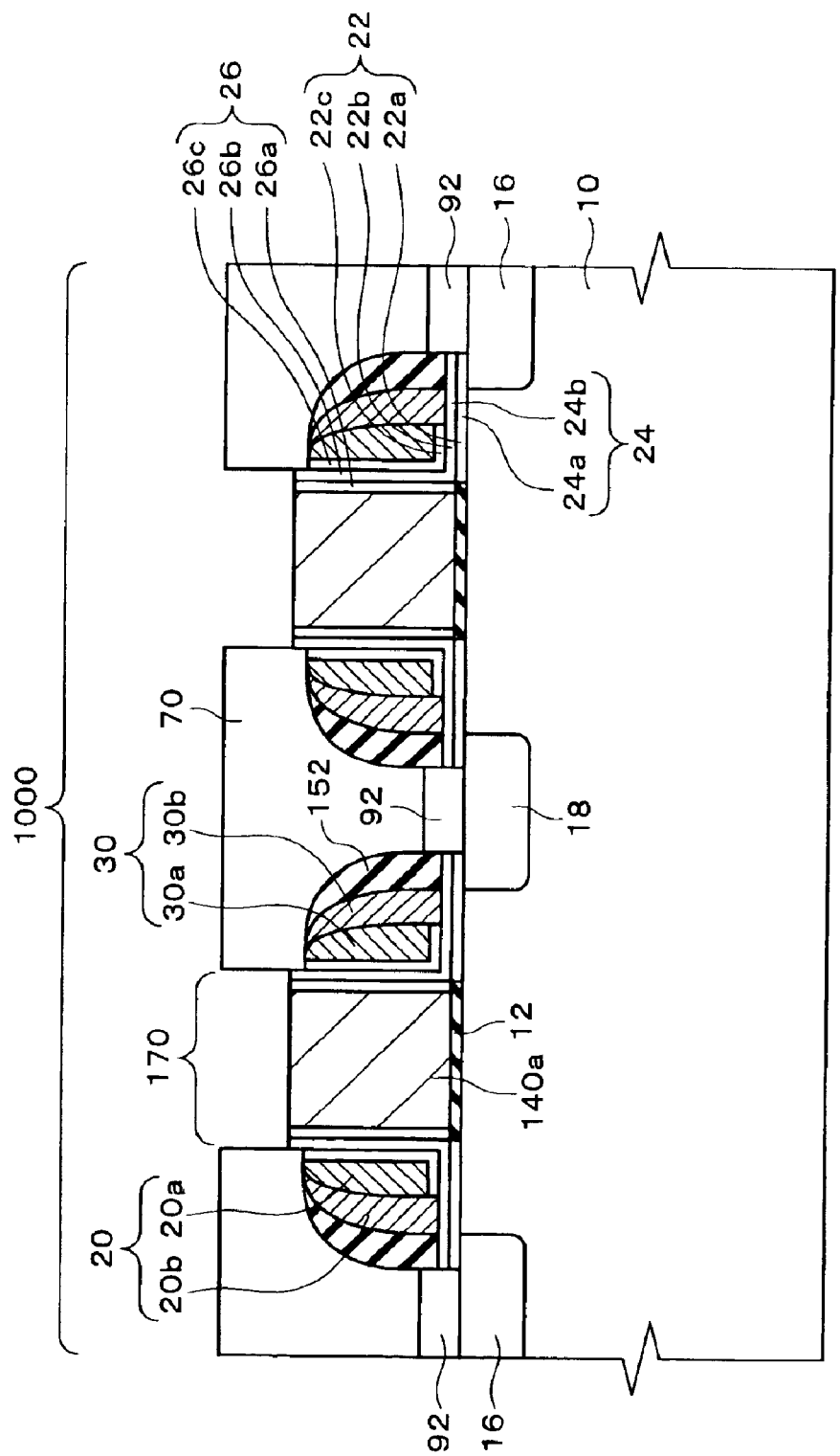
FIG. 16 is a sectional view of one step in the manufacture method in accordance with the first embodiment.

(10) The stopper layer S100 is removed by hot phosphoric acid. As a result, at least the upper surface of the gate layer 140a is exposed to form an aperture portion 170 in the third isolation layer 270, as shown in FIG. 16. In other words, this aperture portion 170 is a region formed by the removal of the stopper layer S100, positioned above the gate layer 140a.

(11) A doped polysilicon layer (not shown in the figures) is subsequently formed over the entire surface. A resist layer (not shown in the figures) is formed by patterning this doped polysilicon layer. The resist layer is used as a mask to pattern the doped polysilicon layer and form the word line 50 (see FIG. 1).

The resist layer is then used as a mask to etch the gate layer 140a. This etching removes the part of the gate layer 140a that does not have the word line 50 formed thereabove. As a result, the word gates 14 can be formed in an array. The removed region of the gate layer 140a corresponds to the region in which a p-type impurity layer (impurity layer for element isolation) 15 will be formed subsequently (see FIG. 1).

Note that the control gates 20 and 30 are covered by the embedded insulation layer 70 so are not etched by this etching step and thus remain.

A p-type impurity is then doped into the entire surface of the semiconductor substrate 10. This forms the p-type impurity layer (impurity layer for element isolation) 15 in regions between the word gates 14 in the Y direction (see FIG. 1). This p-type impurity layer 15 provides reliable element isolation between adjacent memory cells 100.

The above steps enable the manufacture of the semiconductor device of FIGS. 1 and 2.

The advantages provided by the manufacture method of this first embodiment are described below.

After the side-wall shaped conductive layers 232a and 242 have been formed by anisotropic dry etching in the manufacture method in accordance with this embodiment, the etching remainder of the natural oxide film is removed by isotropic etching, to form smooth shapes. The anisotropic etching and isotropic etching are performed again to form the control gates of the desired height, isotropic etching is done again to form smooth shapes, and thus the first control gates 20a and 30a and the second control gates 20b and 30b are formed. In other words, the control gates 20 and 30 are formed by repeated anisotropic etching and isotropic etching. Since the ratio of the silicon etching rate to the silicon oxide etching rate is high with anisotropic etching, if there is any natural oxide film between the side-wall shaped conductive layer 232a and the side-wall shaped conductive layer 242, some of the natural oxide film will remain after the etching and it will not be possible to form the control gates in a favorable manner. With the manufacture method of this embodiment, however, this problem can be prevented by performing anisotropic etching and isotropic etching in combination. As a result, the height of the control gates 20 and 30 can be adjusted easily and thus the control gates 20 and 30 can be formed to the desired shape.

The control gates 20 and 30 are formed by a two-stage process. More specifically, the first control gates 20a and 30a are formed, then the second silicon oxide layer 220c of the ONO film 220 is removed and subsequently the second control gates 20b and 30b are formed. For that reason, the control gates 20 and 30 can be formed on top of insulation layers of different thicknesses. As a result, it becomes possible to manufacture a semiconductor device in which the field strengths of the control gates 20 and 30 and the substrate surface are non-uniform.

2.2 Second Embodiment

Figure 17:
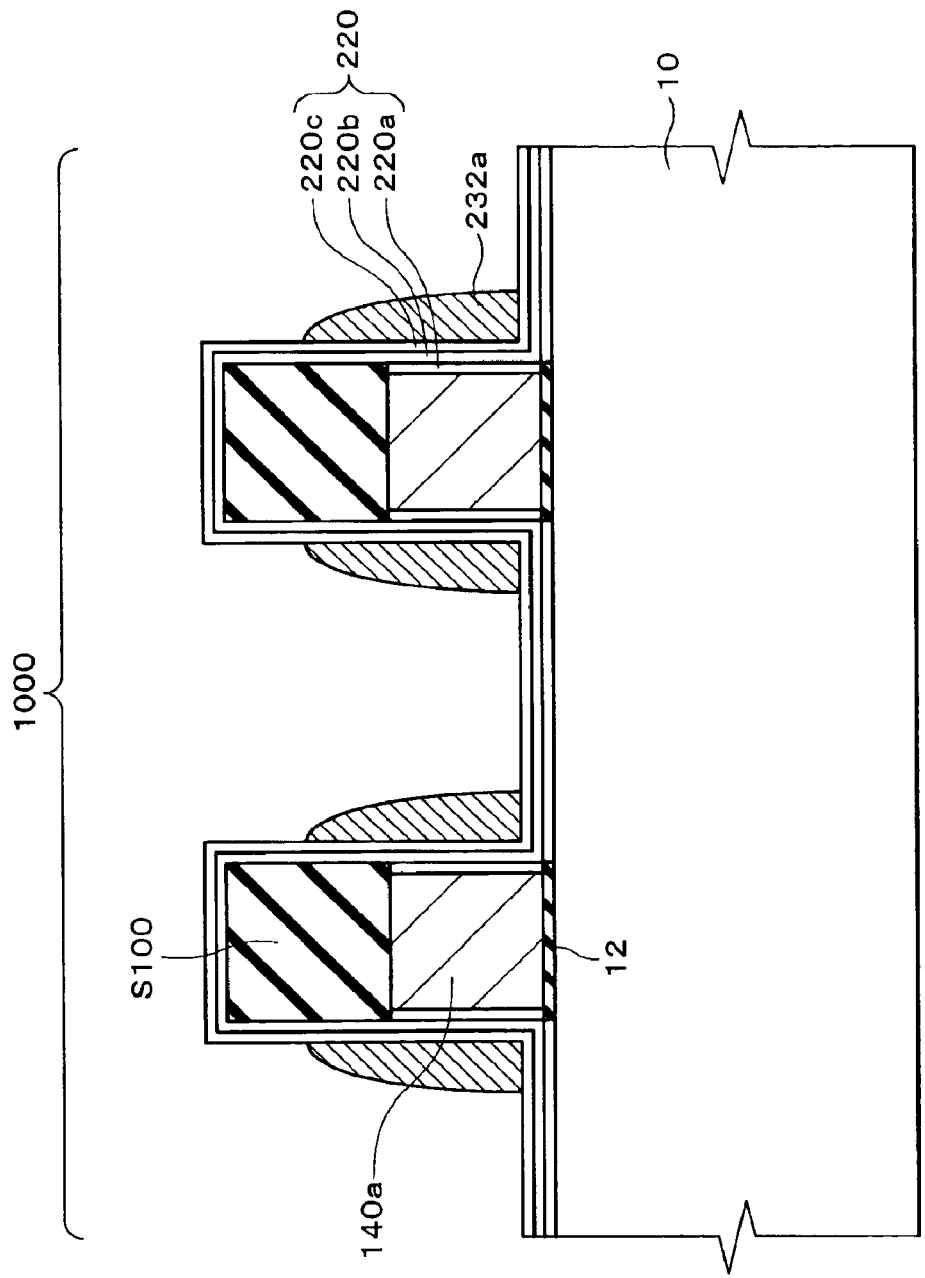
FIG. 17 is a sectional view of one step in the manufacture method in accordance with the second embodiment.
Figure 18:
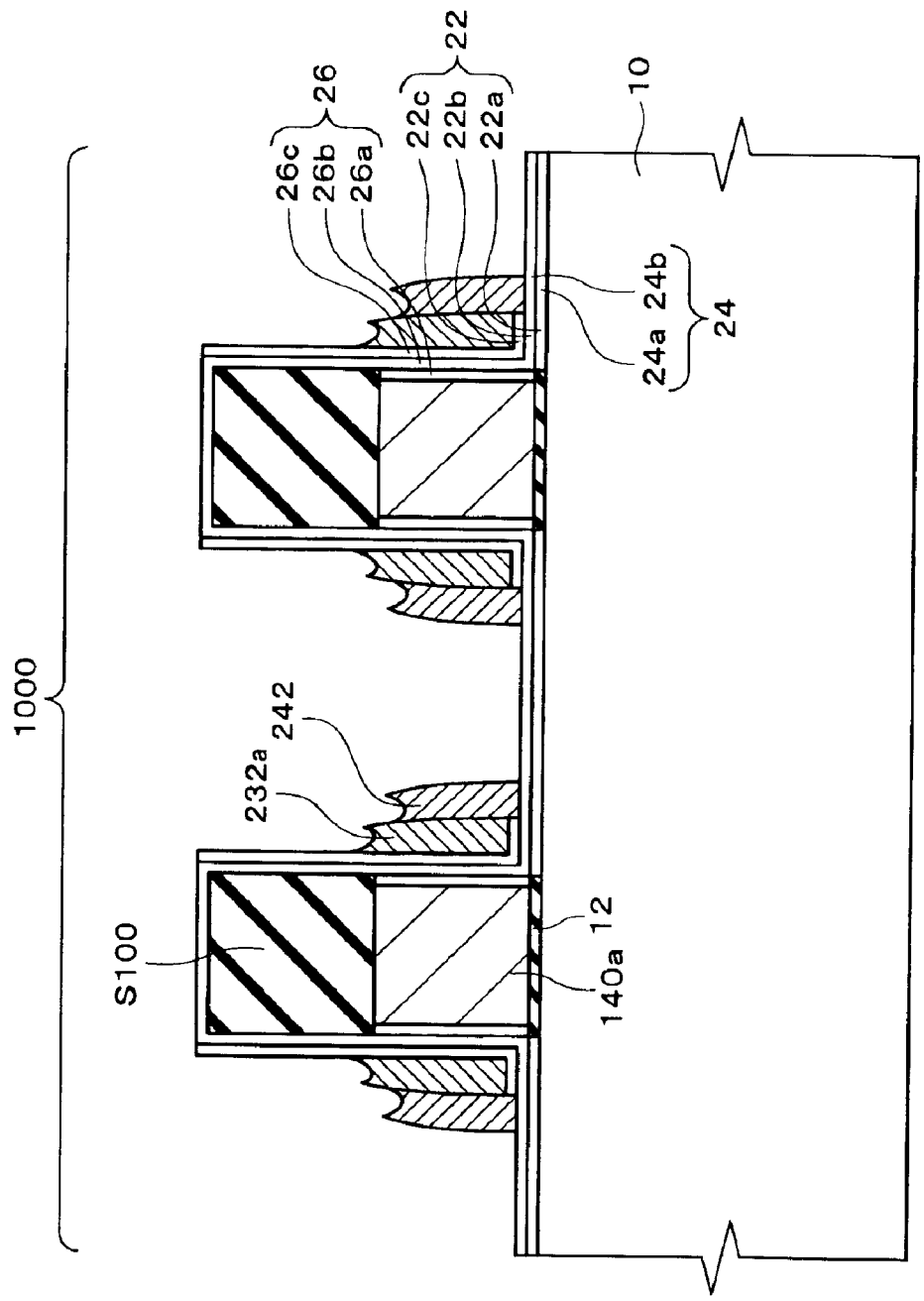
FIG. 18 is a sectional view of one step in the manufacture method in accordance with the second embodiment.

The description now turns to a method of manufacturing a semiconductor device in accordance with a second embodiment, with reference to FIGS. 17 and 18. Note that steps that are similar to those of the first embodiment are described with reference to figures in common with the first embodiment. Steps (1) to (4) are the same as those of the first embodiment.

(5) The entire surface of the doped polysilicon layer 230 is then subjected to anisotropic etching. This forms the side-wall shaped conductive layer 232a along the side surfaces of the aperture portions 160 and 180 of the memory region 1000 (see FIG. 5), as shown in FIG. 17. The side-wall shaped conductive layer 232a will become the first control gates 20a and 30a in a subsequent etching step. During this time, the side-wall shaped conductive layer 232a is preferably formed in such a manner than the position of the peak portion thereof is lower than the upper surface of the stack of the gate layer 140a and the stopper layer S100 but higher than the upper surface of the gate layer 140a. If the peak portion of the side-wall shaped conductive layer 232a were positioned below the upper surface of the gate layer 140a, it might not be possible to form the side-wall shaped conductive layer 242 in a favorable manner.

(6) The side-wall shaped conductive layer 232a is then used as a mask for the removal of part of the ONO film 220, as shown in FIG. 9. The second silicon oxide layer 220c could be etched, by way of example, and this etching could be wet etching with dilute hydrofluoric acid. This leaves the first insulation layer 22 that is formed from the ONO film, underneath the first control gates 20a and 30a.

(7) As shown in FIG. 10, the doped polysilicon layer 240 is formed over the entire surface. The entire surface of the doped polysilicon layer 240 is then subjected to anisotropic etching. This lowers the height of the side-wall shaped conductive layer 232a, forming the side-wall shaped conductive layer 242 on the side of the side-wall shaped conductive layer 232a, as shown in FIG. 18. Since this anisotropic etching is done under conditions in which the ratio of the silicon etching rate to the silicon oxide etching rate is high, in a similar manner to the first embodiment, a fence is formed at the boundary between the side-wall shaped conductive layer 232a and the side-wall shaped conductive layer 242, as shown in FIG. 18.

Figure 13:
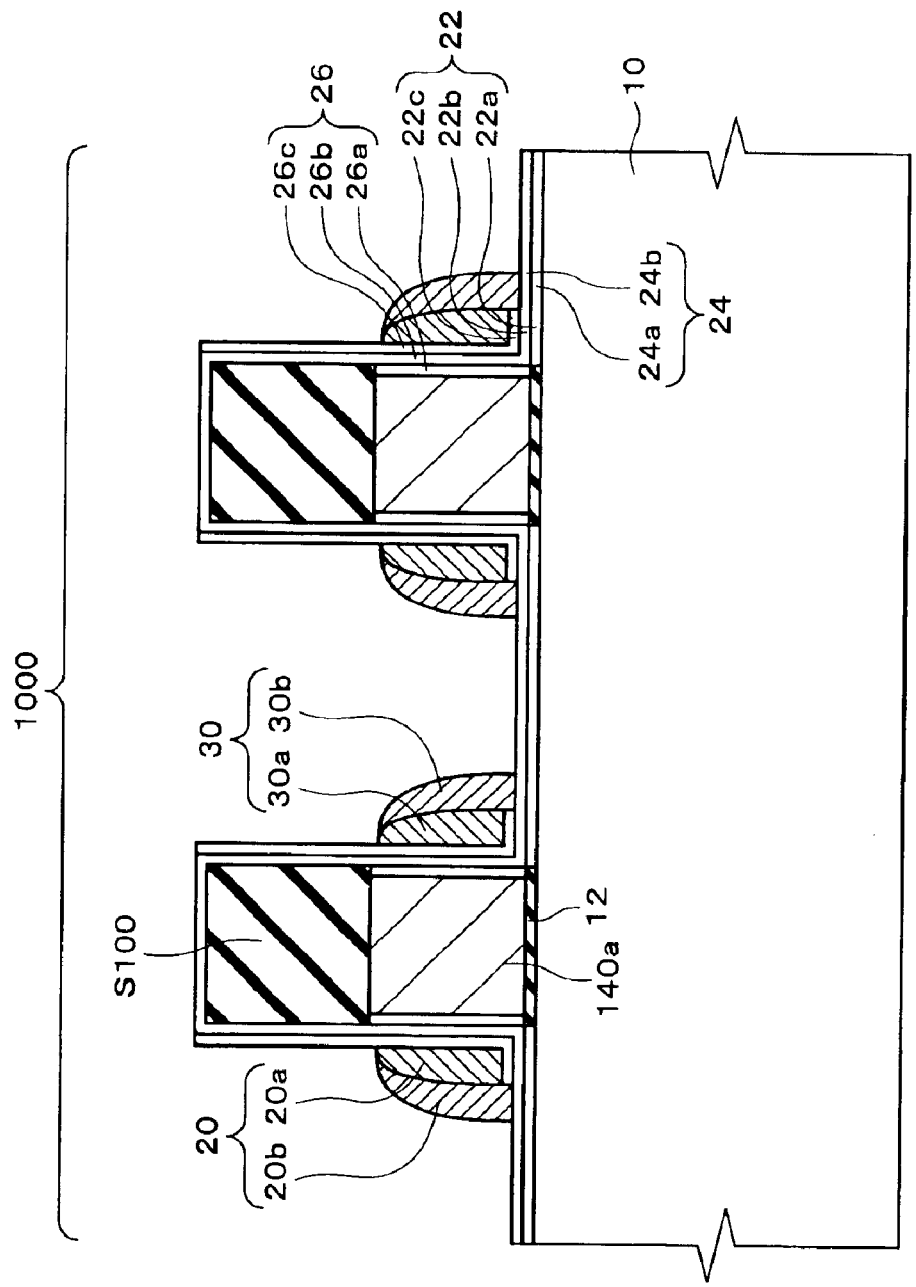
FIG. 13 is a sectional view of one step in the manufacture method in accordance with the first embodiment.

The side-wall shaped conductive layer 232a and the side-wall shaped conductive layer 242 are then subjected to isotropic etching. This forms the first control gates 20a and 30a and the second control gates 20b and 30b, as shown in FIG. 13. This isotropic etching makes it possible to remove the etching remainder formed by the natural oxide film between the side-wall shaped conductive layer 232a and the side-wall shaped conductive layer 242, smoothing the surfaces. This isotropic etching could be chemical dry etching, by way of example.

Steps similar to those of (8) to (11) of the first embodiment are then performed, enabling the formation of a semiconductor device in accordance with the method of manufacturing a semiconductor device of this embodiment.

The advantages provided by method of manufacturing's a semiconductor device in accordance with the second embodiment are described below.

With this embodiment, the side-wall shaped conductive layer 232a is formed in step (5) so that the position of the peak portion thereof is lower than the upper surface of the stopper layer S100. This makes it possible to lower the position of the fence created during the formation of the first control gates 20a and 30a and the second control gates 20b and 30b. Thus the control gates 20 and 30 can be formed to any desired height. As a result, it is possible to prevent short-circuiting between the control gates 20 and 30 and the word gate 14.

2.3 Third Embodiment

Figure 19:
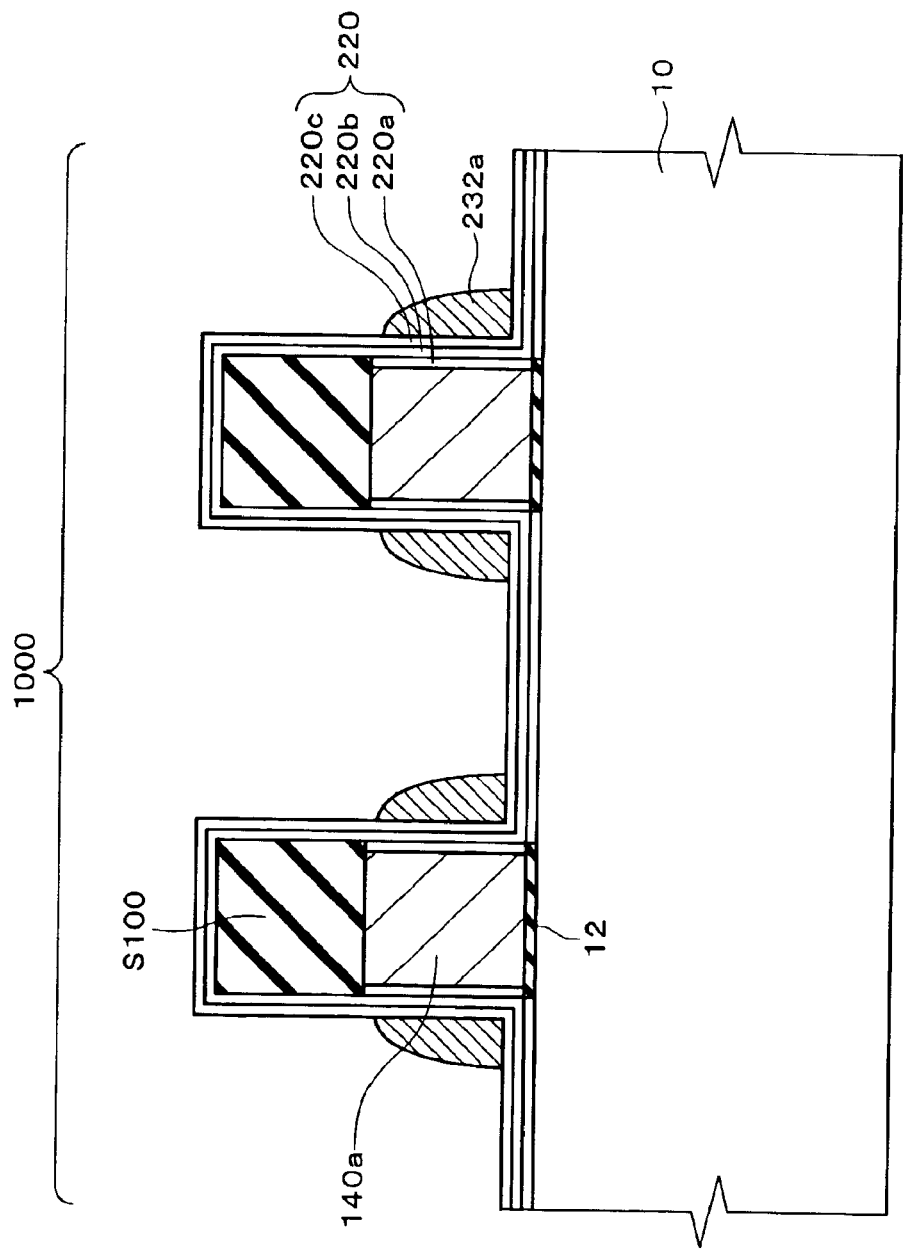
FIG. 19 is a sectional view of one step in the manufacture method in accordance with the third embodiment.
Figure 20:
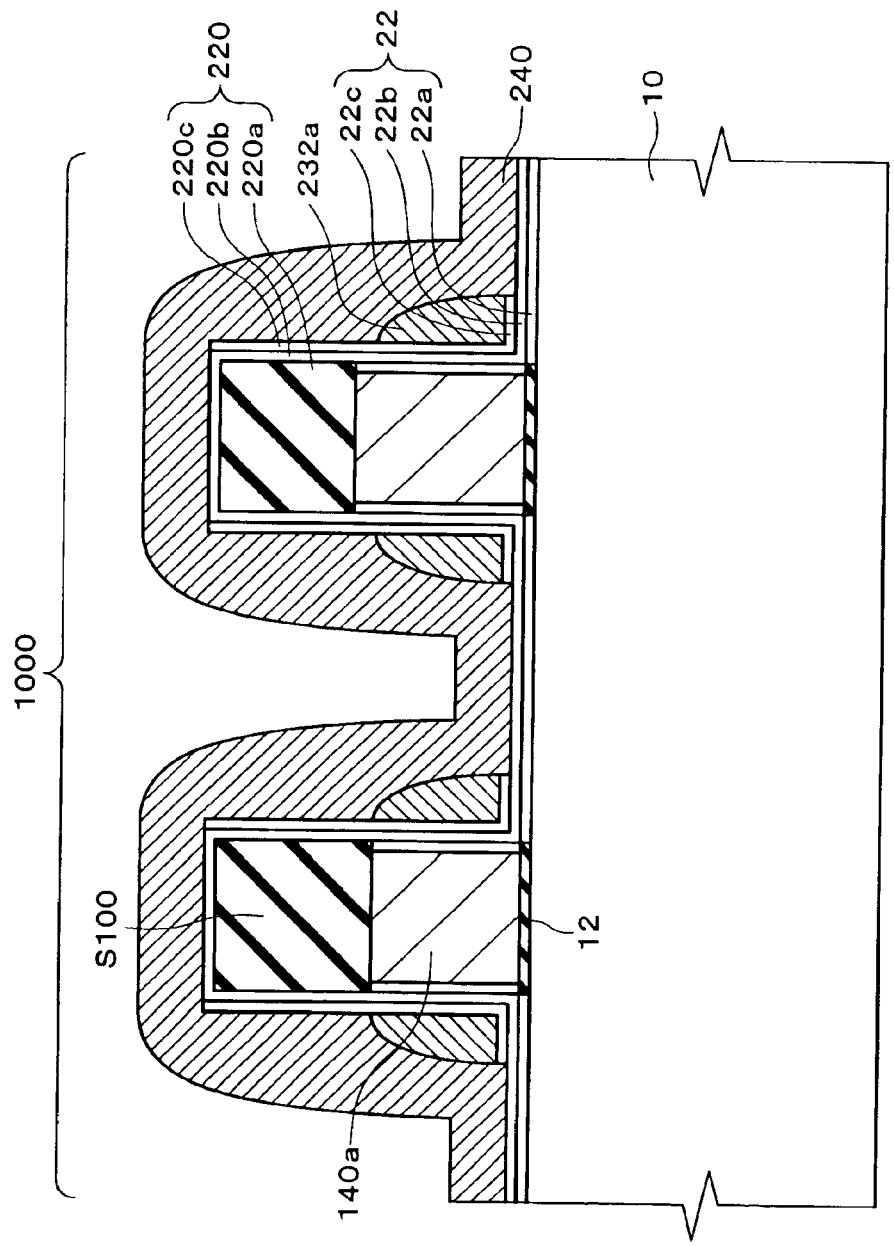
FIG. 20 is a sectional view of one step in the manufacture method in accordance with the third embodiment.
Figure 21:
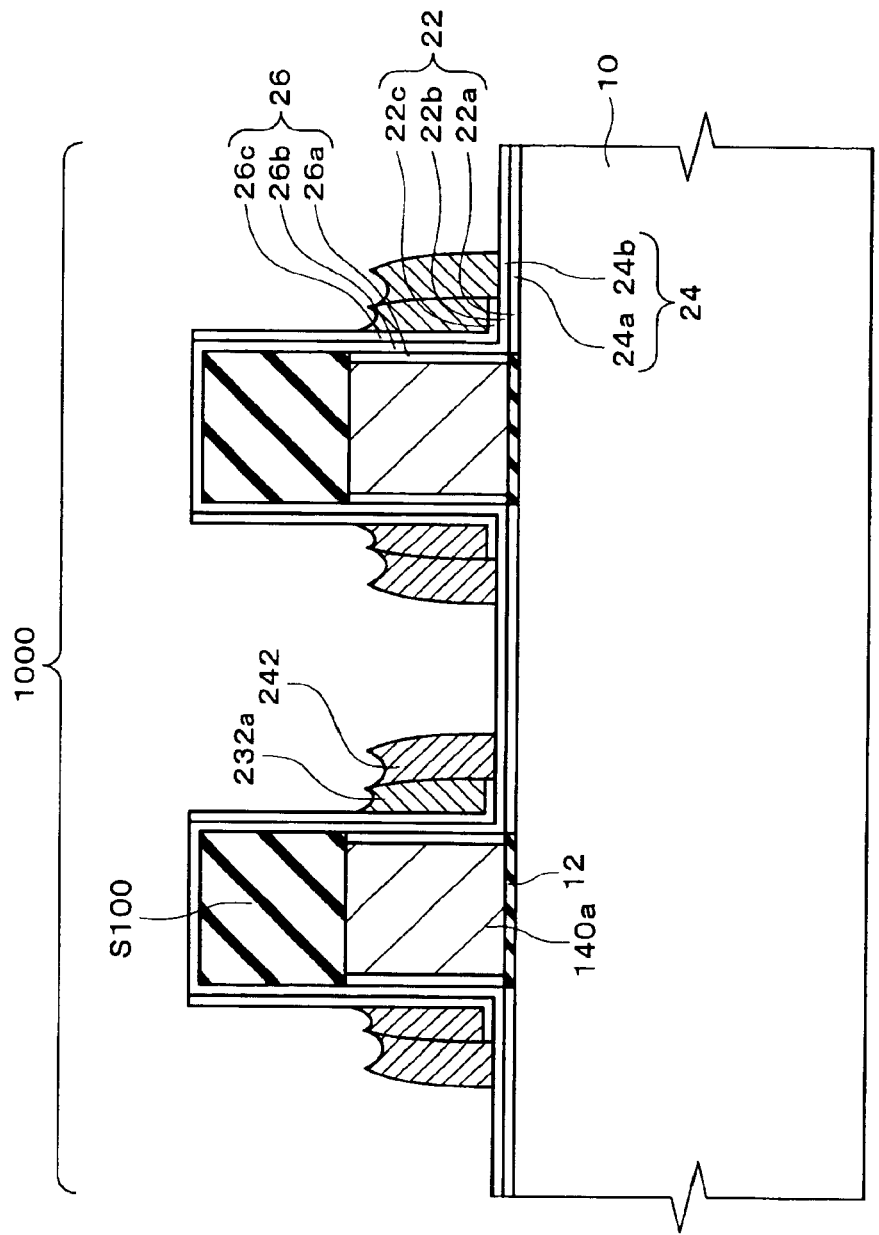
FIG. 21 is a sectional view of one step in the manufacture method in accordance with the third embodiment.
Figure 22:
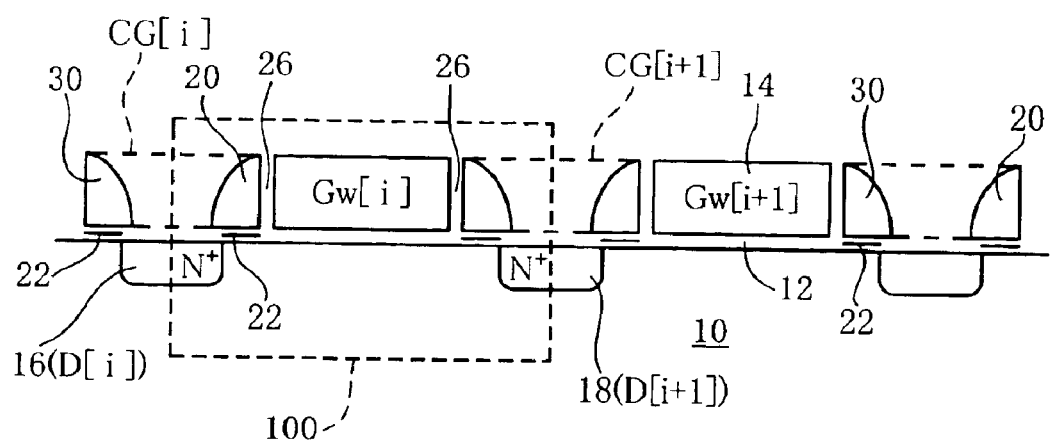
FIG. 22 is a section taken through a known MONOS type of memory cell.

The description now turns to a method of manufacturing a semiconductor device in accordance with a third embodiment, with reference to FIGS. 19 to 21. Note that steps that are similar to those of the first embodiment are described with reference to figures in common with the first embodiment. Steps (1) to (4) are the same as those of the first embodiment.

(5) The entire surface of the doped polysilicon layer 230 is then subjected to anisotropic etching. This forms the side-wall shaped conductive layer 232a along the side surfaces of the aperture portions 160 and 180 of the memory region 1000 (see FIG. 5), as shown in FIG. 19. The side-wall shaped conductive layer 232a is preferably formed in such a manner than the position of the peak portion thereof is lower than the upper surface of the stack of the gate layer 140a. The side-wall shaped conductive layer 232a will become the first control gates 20a and 30a in a subsequent etching step.

(6) The side-wall shaped conductive layer 232a is then used as a mask for the removal of part of the ONO film 220, as shown in FIG. 9. The second silicon oxide layer 220c could be etched, by way of example, and this etching could be wet etching with dilute hydrofluoric acid. This leaves the first insulation layer 22 that is formed from the ONO film, underneath the first control gates 20a and 30a.

(7) As shown in FIG. 20, the doped polysilicon layer 240 is formed over the entire surface. This time, the doped polysilicon layer 240 preferably has a film thickness that is greater than the width of the second control gates 20b and 30b. This ensures sufficient film thickness to enable the formation of the side-wall shaped conductive layer 242 in a favorable manner in the isotropic etching described below.

The entire surface of the doped polysilicon layer is then subjected to anisotropic etching. This lowers the height of the side-wall shaped conductive layer 232a, forming the side-wall shaped conductive layer 242 on the side of the side-wall shaped conductive layer 232a, as shown in FIG. 21. The side-wall shaped conductive layer 242 will become the second control gates 20b and 30b in a subsequent step.

Since this anisotropic etching is done under conditions in which the ratio of the silicon etching rate to the silicon oxide etching rate is high, in a similar manner to the first embodiment, a fence is formed at the boundary between the side-wall shaped conductive layer 232a and the side-wall shaped conductive layer 242, as shown in FIG. 18.

The height of the side-wall shaped conductive layer 232a is then lowered by isotropic etching to form the first control gates 20a and 30a and also the height of the side-wall shaped conductive layer 242 is lowered to form the second control gates 20b and 30b by reducing the width thereof, as shown in FIG. 13.

Steps similar to those of (8) to (11) of the first embodiment are then performed, enabling the formation of a semiconductor device in accordance with the method of manufacturing a semiconductor device of this embodiment.

The advantages provided by method of manufacturing a semiconductor device in accordance with the third embodiment are described below.

With this embodiment, the side-wall shaped conductive layer 232a is formed at a position below the upper surface of the gate layer 140a. In addition, the doped polysilicon layer for the second control gates 20b and 30b is formed at a film thickness that is greater than the desired width of the second control gates 20b and 30b. This ensures that the position of the fence can be lowered and also that sufficient isotropic etching can be performed. As a result, the control gates 20 and 30 can be formed in a favorable manner.

The present invention was described above with respect to embodiments thereof, but the present invention is not limited thereto and thus there are various different modifications thereto within the scope of the invention laid out herein. For example, a semiconductor substrate in bulk form was used as the semiconductor layer in the above described embodiments, but it is equally possible to use a semiconductor layer of a SOI substrate. Note that this was denoted a "semiconductor layer" in the above-described embodiments.

What is claimed is:

1. A method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:

(a) forming a gate insulation layer above a semiconductor layer;

(b) forming a first conductive layer above the gate insulation layer;

(c) forming a stopper layer above the first conductive layer;

(d) patterning the stopper layer and the first conductive layer, to form a stack of layers formed of that stopper layer and that first conductive layer;

(e) forming a first insulation layer over the entire surface of the memory region;

(f) forming a second conductive layer above the first insulation layer, then forming a first side-wall conductive layer on each of two opposed side surfaces of the first conductive layer, and on the semiconductor layer with the first insulation layer interposed, by anisotropic etching of the second conductive layer;

(g) forming a third conductive layer over the entire surface of the memory region, then forming a second side-wall conductive layer on a side surface of the first conductive layer, and on the semiconductor layer with a second insulation layer interposed, by anisotropic etching of that third conductive layer;

(h) forming first and second control gates by isotropic etching of the first and second side-wall conductive layers;

(i) forming an impurity layer to be a source region or a drain region within the semiconductor layer;

(j) forming a third insulation layer over the entire surface of the memory region then removing the third insulation layer so that at least part of the stopper layer is exposed; and (k) removing the stopper layer, then forming a fourth conductive layer and patterning the fourth conductive layer to form a word line.

2. The method of manufacturing a semiconductor device as defined by claim 1, further comprising:

using the first side-wall conductive layer as a mask to remove part of the first insulation layer, and defining part of the remaining first insulation layer under the removed portion as the second insulation layer, after step (f).

3. The method of manufacturing a semiconductor device as defined by claim 1, further comprising at least one set of:

performing anisotropic etching of the first and second side-wall conductive layers after performing isotropic etching of the first and second side-wall conductive layers, to adjust the heights of the first and second side-wall conductive layers, after step (g).

4. The method of manufacturing a semiconductor device as defined by claim 1, wherein in step (f), the first side-wall conductive layer is formed in such a manner that a peak portion of the first side-wall conductive layer is positioned lower than an upper surface of the stack of layers but above the conductive layer that forms the stack of layers.

5. The method of manufacturing a semiconductor device as defined by claim 1, wherein in step (f), the first side-wall conductive layer is formed in such a manner that a peak portion of the first side-wall conductive layer is positioned lower than an upper surface of the conductive layer that forms the stack of layers.

6. The method of manufacturing a semiconductor device as defined by claim 5, wherein the third conductive layer has a film thickness that is greater than the width of the second control gate.

7. The method of manufacturing a semiconductor device as defined by claim 1, wherein the isotropic etching is performed by chemical dry etching.

8. The method of manufacturing a semiconductor device as defined by claim 1, wherein the first insulation layer is a stack of a first silicon oxide film, a silicon nitride film, and a second silicon oxide film.

* * * * *